United States Patent
Lee et al.

(10) Patent No.: US 6,563,742 B1
(45) Date of Patent: May 13, 2003

(54) METHOD TO TURN A FLASH MEMORY INTO A VERSATILE, LOW-COST MULTIPLE TIME PROGRAMMABLE EPROM

(75) Inventors: Peter W. Lee, Saratoga, CA (US); Tam H. Tran, San Jose, CA (US)

(73) Assignee: Aplus Flash Technology, Inc., San Jose, CA (US)

( * ) Notice: Subject to any disclaimer, the term of this patent is extended or adjusted under 35 U.S.C. 154(b) by 0 days.

(21) Appl. No.: 10/090,356

(22) Filed: Mar. 4, 2002

Related U.S. Application Data

(60) Provisional application No. 60/273,002, filed on Mar. 2, 2001.

(51) Int. Cl.[7] .............................................. G11C 16/00
(52) U.S. Cl. ................. 365/185.29; 365/63; 365/185.22
(58) Field of Search ....................... 365/185.29, 185.22, 365/51, 63, 72, 226

(56) References Cited

U.S. PATENT DOCUMENTS

| | | | | |
|---|---|---|---|---|
| 4,823,318 A | * | 4/1989 | D'Arrigo et al. ...... | 365/185.29 |
| 5,303,180 A | * | 4/1994 | McAdams ................... | 365/63 |
| 5,999,440 A | * | 12/1999 | Crafts ........................ | 365/226 |
| 6,288,599 B1 | * | 9/2001 | Coddington ................ | 365/226 |

* cited by examiner

*Primary Examiner*—Tan T. Nguyen
(74) *Attorney, Agent, or Firm*—George O. Saile; Stephen B. Ackerman; Douglas R. Schnabel

(57) ABSTRACT

A multiple time programmable (MTP) memory device is achieved. The device comprises, first, a memory cell array including a means of electrical erasability and electrical programmability. The memory cell array comprises, preferably, a Flash memory cell array. A package has an external pin configuration that conforms to the JEDEC standard for an EPROM device wherein an external, positive programming voltage (VPP) pin is provided. Finally, an external, negative erasing voltage (VNN) pin is provided. The VNN pin is, preferably, multiplexed with the chip enable bar (CEB) pin.

36 Claims, 23 Drawing Sheets

CONNECTION DIAGRAMS (MTP EPROM, 64kb)
Top View

METHOD TO TURN A FLASH MEMORY INTO A VERSATILE, LOW-COST MULTIPLE TIME PROGRAMMABLE EPROM

This application claims priority to U.S. Provisional Application No. 60/273,002, dated Mar. 2, 2001, and herein incorporated by reference.

BACKGROUND OF THE INVENTION (1) Field of the Invention

The invention relates to a multiple time programmable (MTP), electrically programmable read-only memory (EPROM) device, and more particularly, to a MTP EPROM formed using Flash memory cells.

(2) Description of the Prior Art

For over twenty years, EPROM devices have been used extensively in numerous applications. Traditional EPROM devices come in two package configurations. The first configuration is a ceramic package with a quartz window. The second configuration is a plastic package without a quartz window. The reason for using the more expensive package with the quartz window is to provide for multiple time programmability (MTP) of the EPROM. The memory cell array in the EPROM is erased by exposure to ultraviolet (UV) light through the window. The EPROM memory data becomes all "1" after the UV light erase, regardless of the initial data value ("0" or "1"). During programming, the EPROM data is selectively altered from the erased state ("1") to the programmed state ("0") through an electrical operation controlled by a programmer. In the plastic packages, for example, plastic dual in-line package (PDIP or simply, DIP) and plastic leaded chip carrier (PLCC), the absence of the quartz window eliminates the possibility of MTP. Therefore, these EPROM devices are said to be one-time programmable (OTP).

Referring now to FIG. 1, an exemplary, functional block diagram of a prior art EPROM is illustrated. A cell array 10 comprises standard EPROM cells. These EPROM cells may comprise devices that can store electrical charge on a floating gate. This electrical charge, in turn, alters the threshold voltage of the devices such that the devices are always in either of two, distinctive states. These states are conveniently labeled as the "0" state. and the "1" state. As stated previously, the EPROM cells are electrically programmable from the erased ("1") state to the programmed ("0"). To accomplish this programming, a high voltage signal must be routed to the specific cell that is selected for programming. This high voltage signal, called the positive programming voltage (VPP), is an external signal in the JEDEC standard configurations.

Access to the cell array 10 is controlled by a control logic block 14. The control logic block uses the input signals, chip enable bar (CEB), output enable bar (OEB), and program enable bar (PGMB). CEB is asserted by a low voltage ($V_{il}$) to cause the EPROM memory to be selected. OEB is asserted by a low voltage, $V_{il}$, to cause the output data bus, DQn–DQ0, to be driven. PGMB is an optional signal that is asserted by a low voltage, $V_{il}$, to cause the EPROM to enter programming mode. Note that the OEB and VPP signals may be multiplexed onto the same input pin since the VPP signal is active at a high voltage of, for example, about 12 volts.

When the EPROM is selected by an assertion of CEB, the value of the address bus An–A0 is latched by the address buffers block 18. The address value is then used by the X-Decoder block 26 and the Y-Decoder block 30 to select a specific byte or word within the cell array 10. If the EPROM is being read from, then the OEB signal will be asserted. In this case, the value of the selected byte or word of the memory cell array 10 is presented at the output data bus, DQn–DQ0, by the output buffers block 22. If the EPROM is being written to, the OEB signal will not be asserted. The PGMB signal will be asserted. In this case, the value of the selected byte, or word, which has been externally forced onto the data bus, DQn–DQ0, will be written at the selected memory cell array location.

The prior art EPROM device has no provision for electrical erasure of the memory cell array 10. Only the exposure to UV light, and the requisite expensive packaging, can be used for erasure. In addition, as the EPROM device size and density grows larger, this UV light erase technique may be severely degraded because the UV light. may not be able to reach all of the floating gates in the very small cells.

Referring now to FIGS. 2 through 9, JEDEC standard pin configurations for the most popular, prior art OTP EPROM devices are shown for DIP and PLCC packages. The memory sizes vary between 64 kilobits and 8 megabits. Although the OTP EPROM pin configurations vary with different memory storage capacity, or density, all follow the universal, joint electron device engineering council (JEDEC) standards. Referring particularly to FIG. 2, the JEDEC standard configurations for a 64 kilobit part are shown. The DIP package is a 28-pin part. The PLCC package is a 32-pin part. Note that the VPP signal has a separate pin from the OEB signal. In addition, the PGMB signal is available. Referring to FIG. 3, a 128 kilobit part is shown. Again, VPP is separate from OEB, and PGMB is available.

Referring to FIG. 4, the 256 kilobit part is shown. The key difference at this density is the loss of the PGMB pin. Referring now to FIG. 5, the 512 kilobit part is shown. At this density, the JEDEC standard configuration moves the VPP signal to the same pin as the OEB signal. The VPP signal and OEB signal are multiplexed together.

Referring now to FIG. 6, the 1 megabit EPROM device is shown. The DIP part pin count increases to 32 pins. The PLCC package remains at 32 pins. With the extra pins, the 1 megabit device provides separate VPP and OEB pins as well as a PGMB pin. Referring now to FIG. 7, the 2 megabit EPROM device also provides separate VPP and OEB pins and a PGMB pin.

Referring now to FIG. 8, the 4 megabit OTP EPROM removes the PGMB pin. Finally, referring to FIG. 9, the 8 megabit EPROM combines VPP and OEB as a multiplexed pin.

SUMMARY OF THE INVENTION

A principal object of the present invention is to provide an effective, and very manufacturable, multiple time programmable (MTP) EPROM device conforming to JEDEC EPROM pin configuration standards.

A further object of the present invention is to provide a MTP EPROM using a Flash memory cell array.

A still further object of the present invention is to provide a MTP EPROM based on a Flash memory cell array in which cost is reduced by eliminating the internal charge pumps and state machine.

Another still further object of the present invention is to provide a MTP EPROM based on a Flash memory cell array in which an external, negative erasing voltage (VNN) pin is used.

Another still further object of the present invention is to multiplex an external, negative erasing voltage (VNN) pin with an existing pin.

Another still further object of the present invention is to provide a MTP EPROM based on a Flash memory cell array with threshold voltage ($V_t$) correction capability.

Another further object of the present invention is to provide a method for erasing a MTP EPROM.

Another further object of the present invention is to provide a method for programming a MTP EPROM.

Another further object of the present invention is to provide a method for correcting the threshold voltage ($V_t$) of a MTP EPROM.

In accordance with the objects of this invention a multiple time programmable memory device is achieved. The device comprises, first, a memory cell array including a means of electrical erasability and electrical programmability. A package has an external pin configuration that conforms to the JEDEC standard for an EPROM device wherein an external, positive programming voltage (VPP) pin is provided. Finally, an external, negative erasing voltage (VNN) pin is provided.

Also in accordance with the objects of the present invention, a method to electrically erase a multiple time programmable device is achieved. The multiple time programmable device comprises, first, a memory cell array including a means of electrical erasability and electrical programmability. A package has a pin configuration that conforms to the JEDEC standard for an EPROM device and has an external, positive programming voltage (VPP) pin. Finally, an external, negative erasing voltage (VNN) pin is multiplexed with a chip enable bar (CEB) pin. The method comprises, first, asserting the external, negative erasing voltage (VNN) pin. The external, positive programming voltage (VPP) pin is asserted. Finally, the address bus of the device is forced to a selected address to thereby selectively erase a part of the memory cell array. The erased part may comprise either a single memory array block or the whole memory array.

Also in accordance with the objects of the present invention, a method to electrically program a multiple time programmable device is achieved. The multiple time programmable device comprises, first, a memory cell array including a means of electrical erasability and electrical programmability. A package has a pin configuration that conforms to the JEDEC standard for an EPROM device and has an external, positive programming voltage (VPP) pin. Finally, an external, negative erasing voltage (VNN) pin is multiplexed with a chip enable bar (CEB) pin. The method comprises, first, forcing the address bus of the device to an address value equal to a starting address. The external, positive programming voltage (VPP) pin is asserted. Finally, a sequence of memory cell locations are programmed wherein the programming comprises, first, forcing the data bus of the device to a selected value. The chip enable bar (CEB) pin is asserted to thereby write the selected value to the selected address of the memory cell array. The chip enable bar (CEB) pin is de-asserted. Finally, the address value is tested. The address value is incremented and the programming sequence is repeated if less than a final value. The programming sequence ends if equal to the final value.

Also in accordance with the objects of the present invention, a method to correct a threshold voltage ($V_t$) of a multiple time programmable device is achieved. The multiple time programmable device comprises, first, a memory cell array including a means of electrical erasability and electrical programmability. A package has a pin configuration that conforms to the JEDEC standard for an EPROM device and has an external, positive programming voltage (VPP) pin. Finally, an external, negative erasing voltage (VNN) pin is multiplexed with a chip enable bar (CEB) pin. The method comprises, first, asserting the external, positive programming voltage (VPP) pin. The external, negative erasing voltage (VNN) pin is asserted. Finally, a correction select pin is asserted to threshold correct the memory array.

Also in accordance with the objects of the present invention, a method correct a threshold voltage ($V_t$) of a multiple time programmable device is achieved. The multiple time programmable device comprises, first, a memory cell array including a means of electrical erasability and electrical programmability. A package has a pin configuration that conforms to the JEDEC standard for an EPROM device and has an external, positive programming voltage (VPP) pin. Finally, an external, negative erasing voltage (VNN) pin is multiplexed with a chip enable bar (CEB) pin. The method comprises, first, asserting the external, negative erasing voltage (VNN) pin. The address bus of the device is forced to an address value equal to a starting address. The external, positive programming voltage (VPP) pin is asserted. Finally, a sequence of memory cell locations is threshold corrected wherein the threshold correcting comprises, first, asserting a correction select pin to threshold correct the address value in the memory cell array. The correction select pin is then de-asserted. Finally, the address value is tested. The address value is incremented and the threshold correcting sequence is repeated if less than a final value. The threshold correcting sequence ends if equal to the final value.

BRIEF DESCRIPTION OF THE DRAWINGS

In the accompanying drawings forming a material part of this description, there is shown.

DESCRIPTION OF THE PREFERRED EMBODIMENTS

The preferred embodiments disclose a novel, MTP EPROM device of the present invention. In the preferred embodiment, a Flash cell array is used to create an MTP EPROM device that is low cost and is compatible with the JEDEC standard pin configurations. Preferred embodiments of methods to erase, program, and threshold voltage ($V_t$) correct the MTP EPROM are also disclosed. It should be clear to those experienced in the art that the present invention can be applied and extended without deviating from the scope of the present invention.

Figure 1:
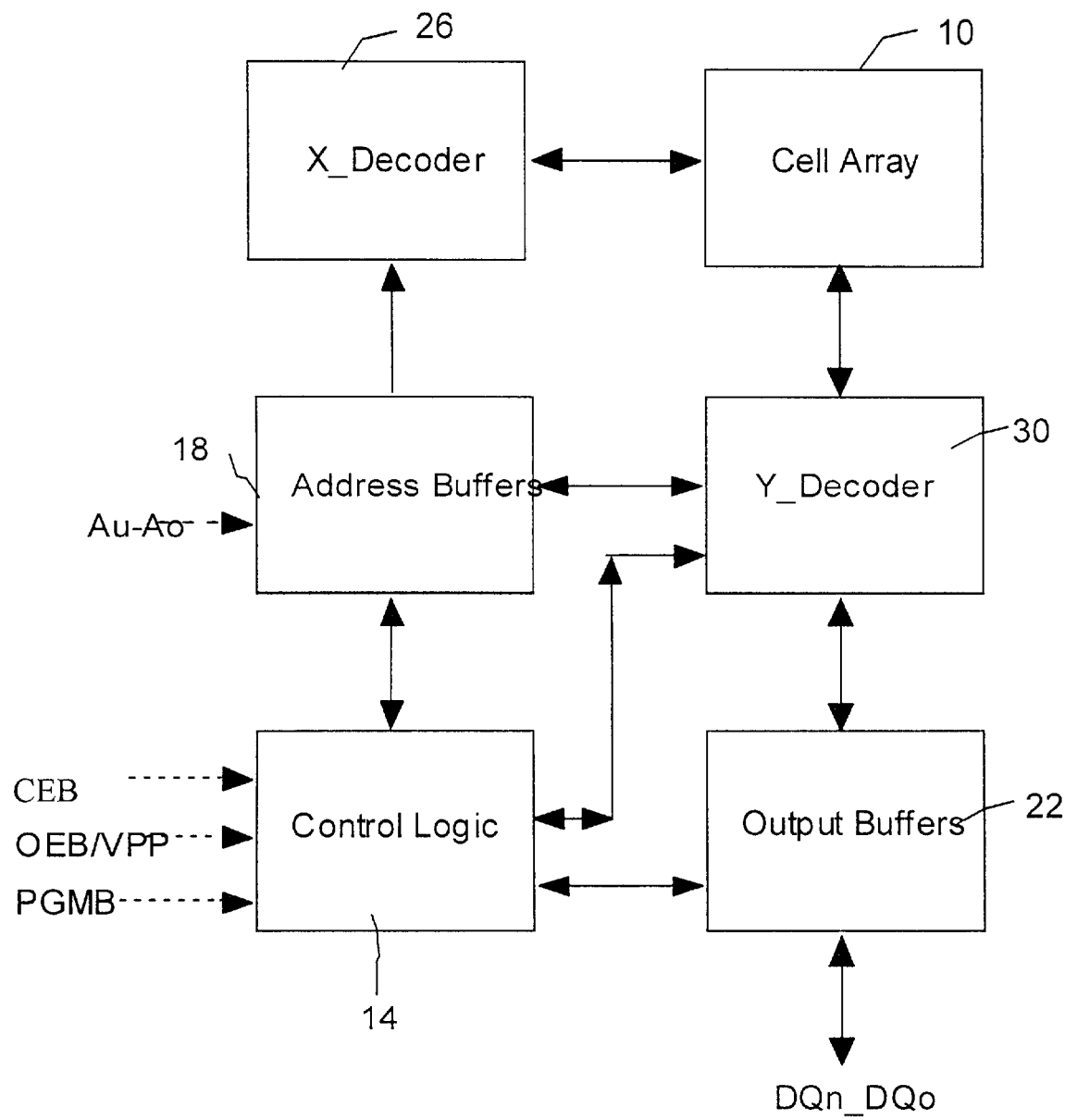
FIG. 1 illustrates an exemplary, functional block diagram of a prior art EPROM.
Figure 2:
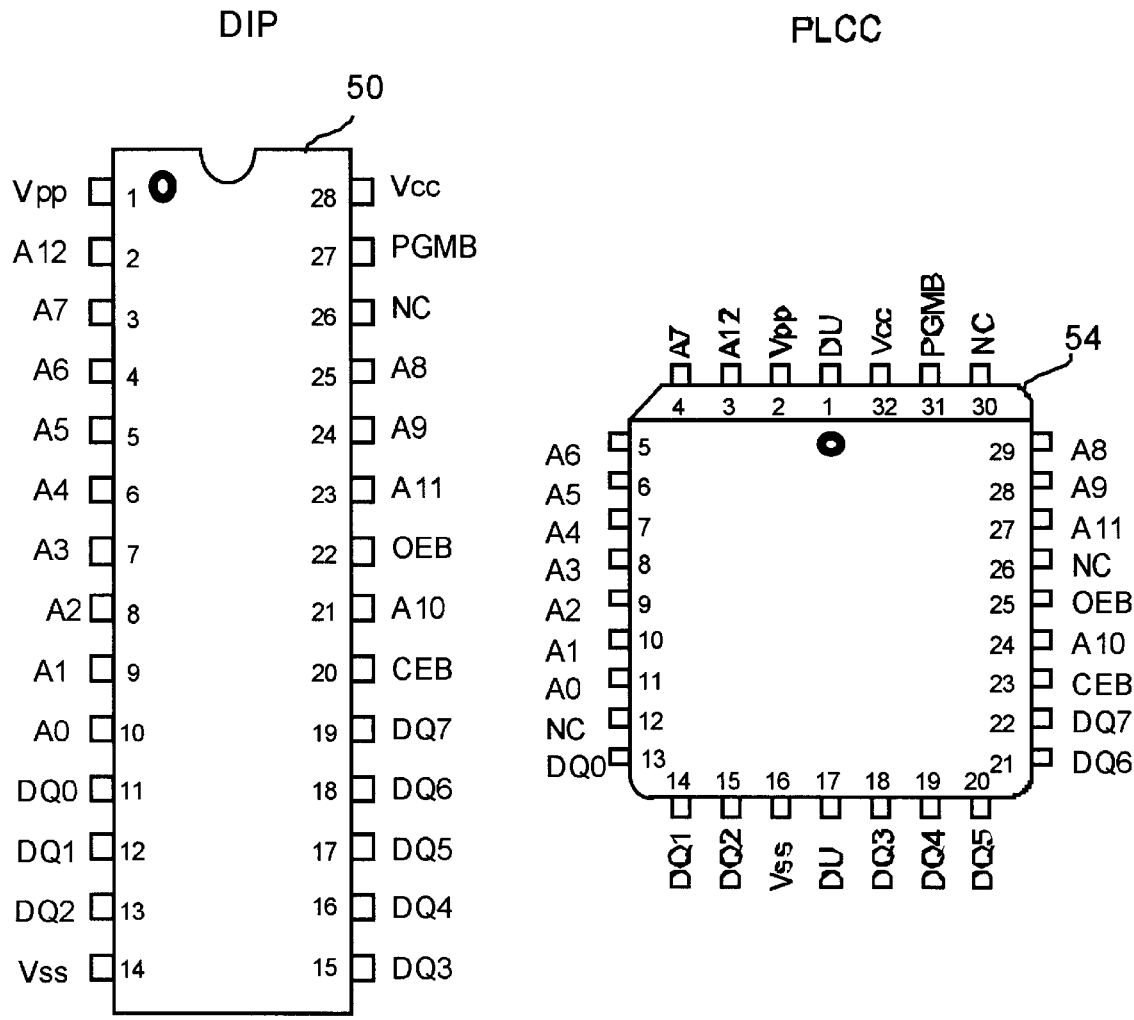
FIGS. 2 through 9 illustrate JEDEC standard pin configurations for prior art OTP EPROM devices in DIP and PLCC packages at memory sizes between 64 kilobits and 8 megabits.
Figure 3:
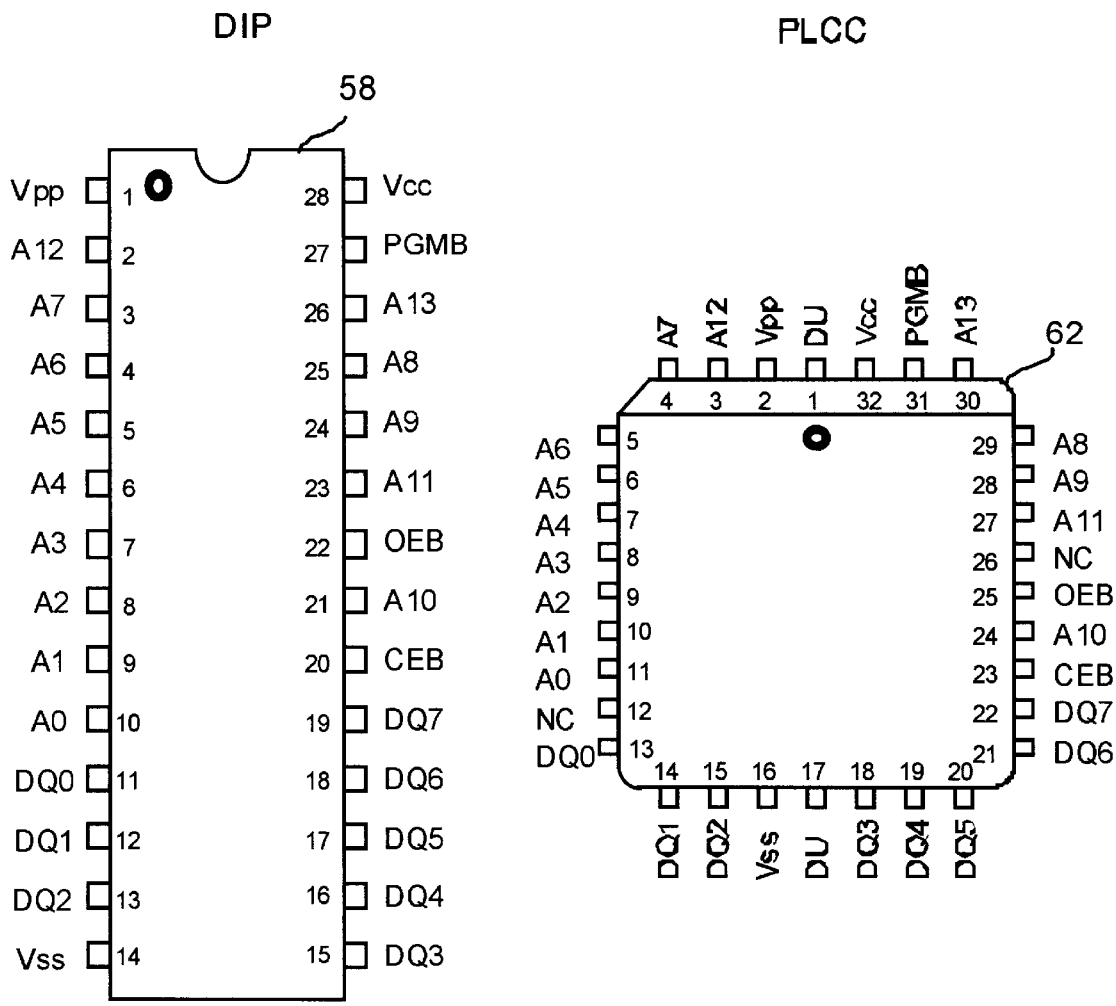
Figure 4:
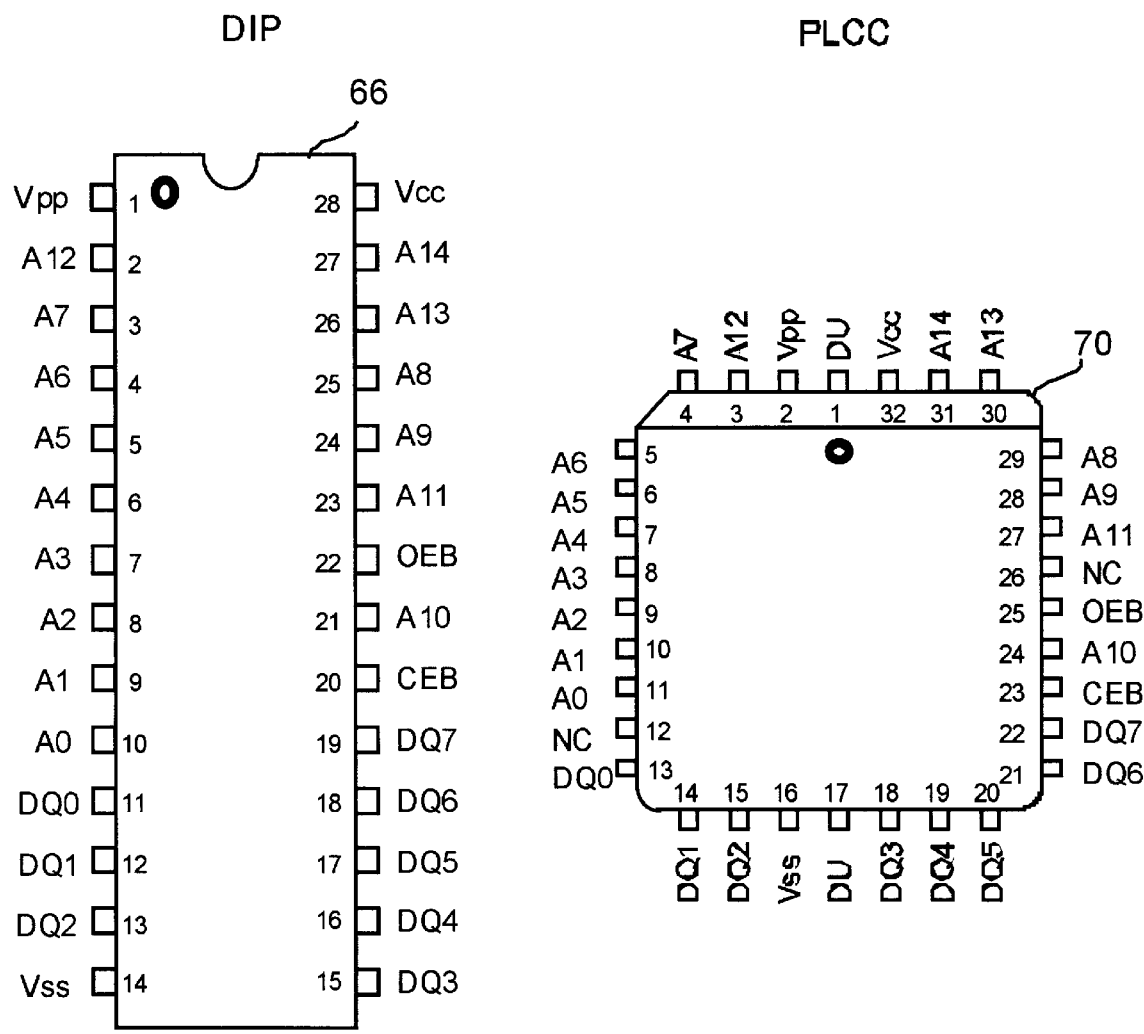
Figure 5:
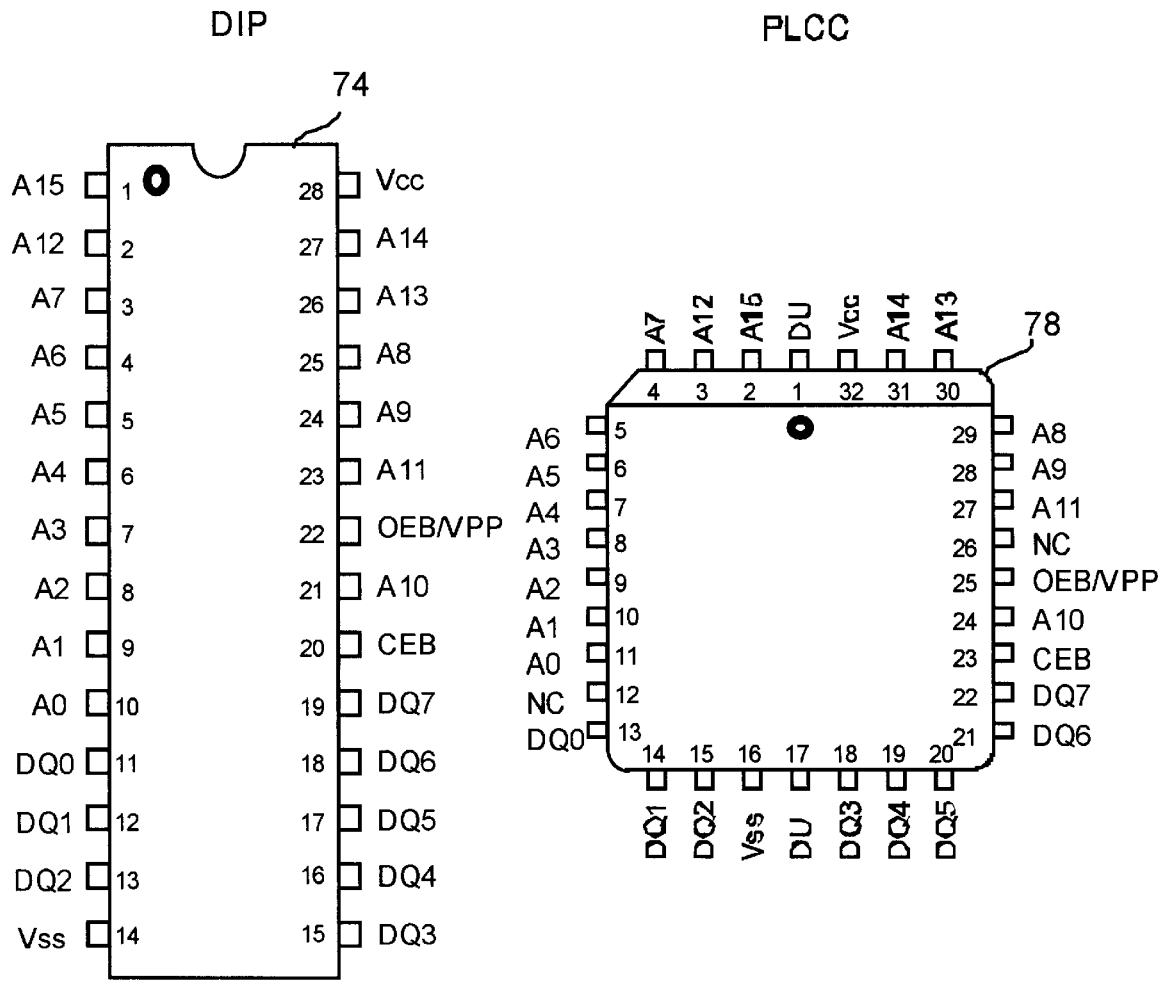
Figure 6:
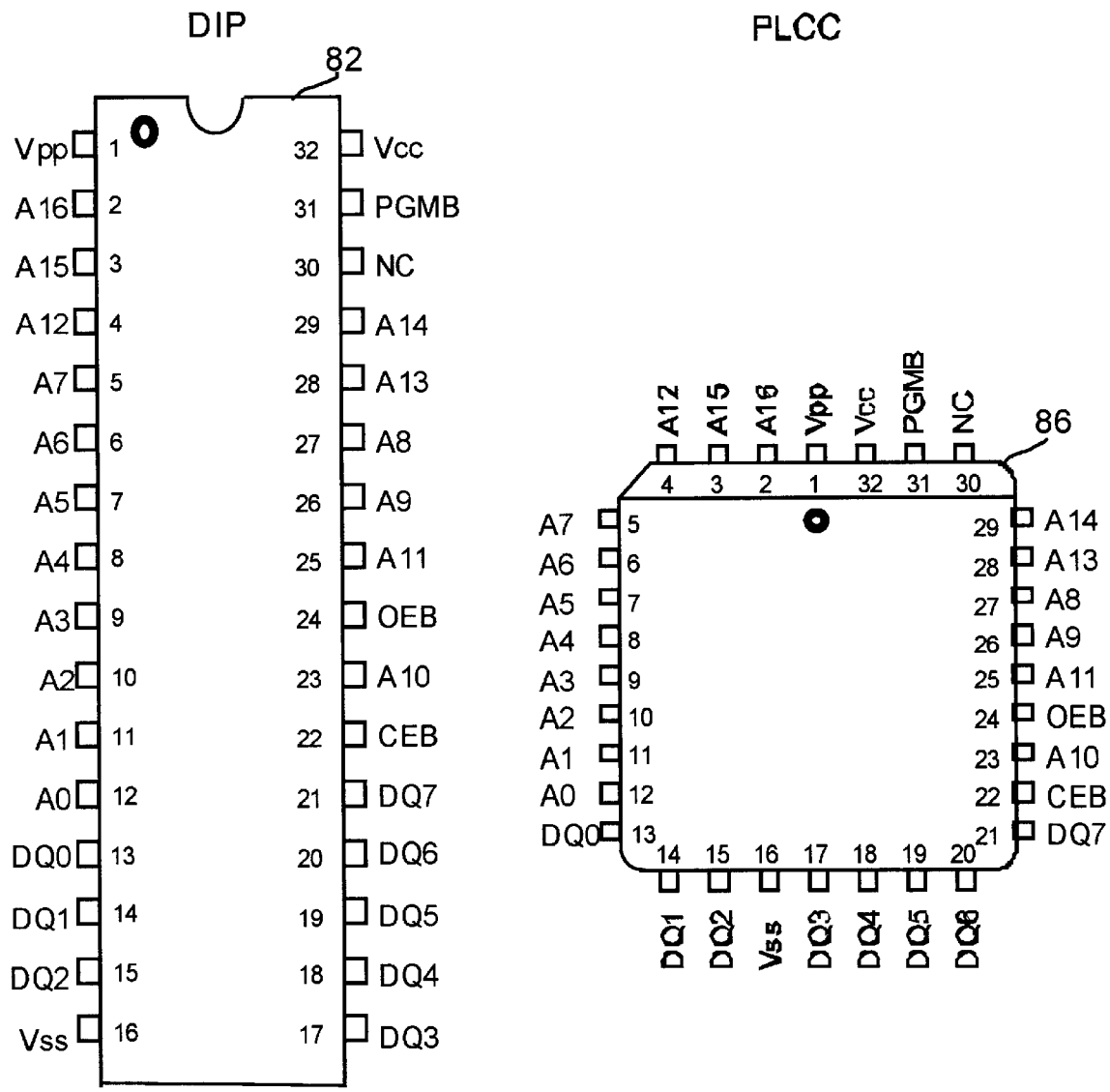
Figure 7:
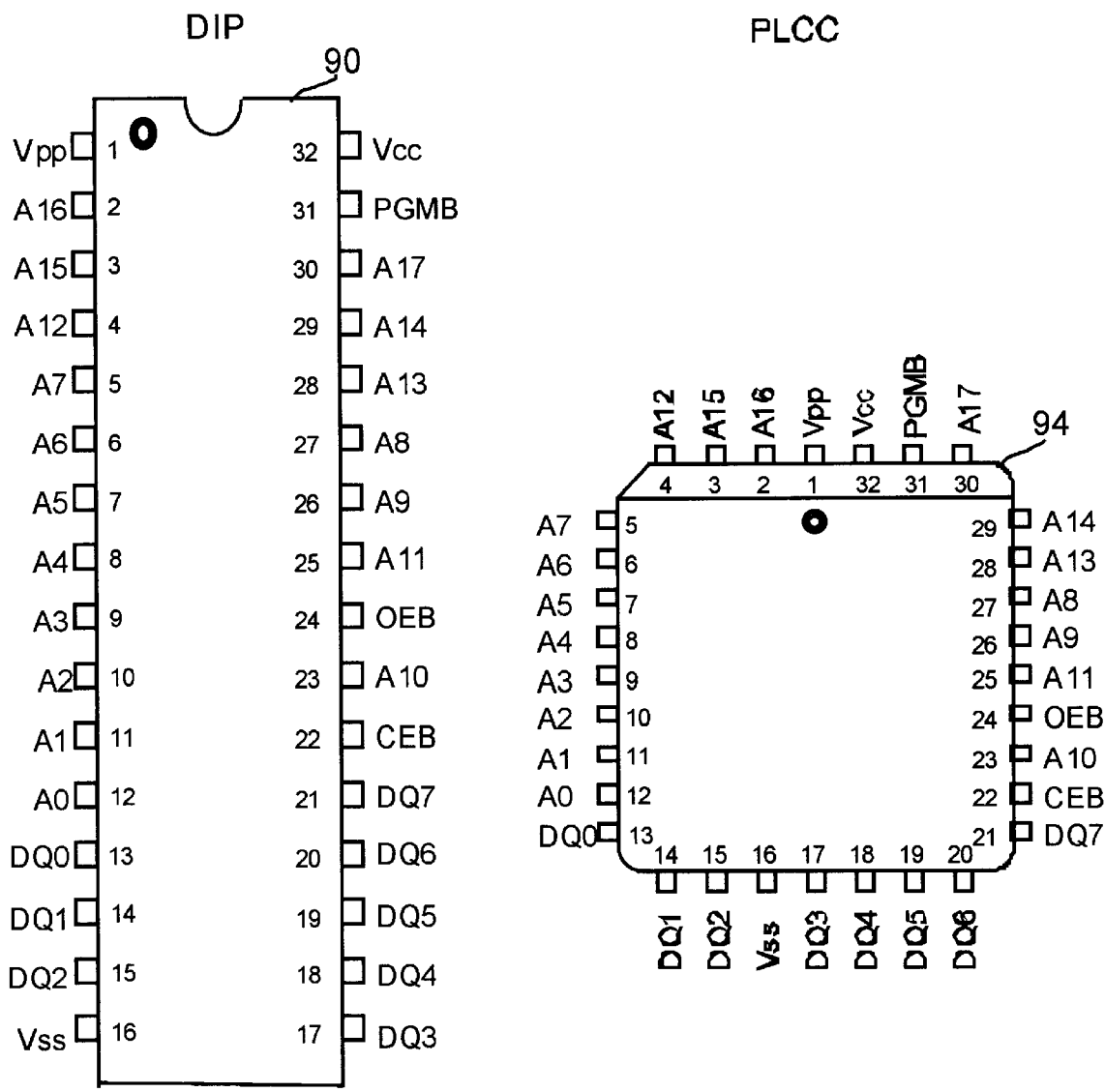
Figure 8:
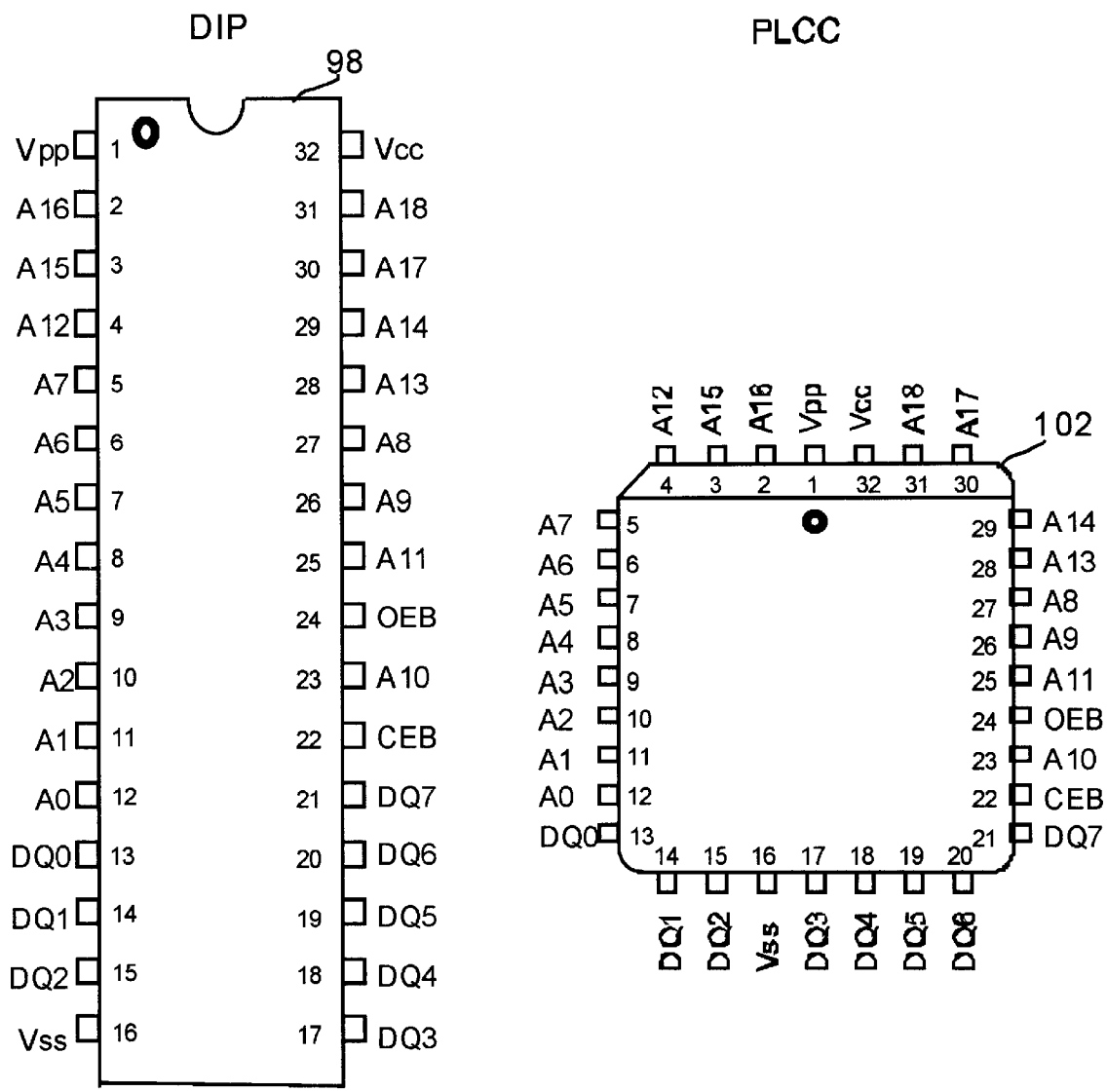
Figure 9:
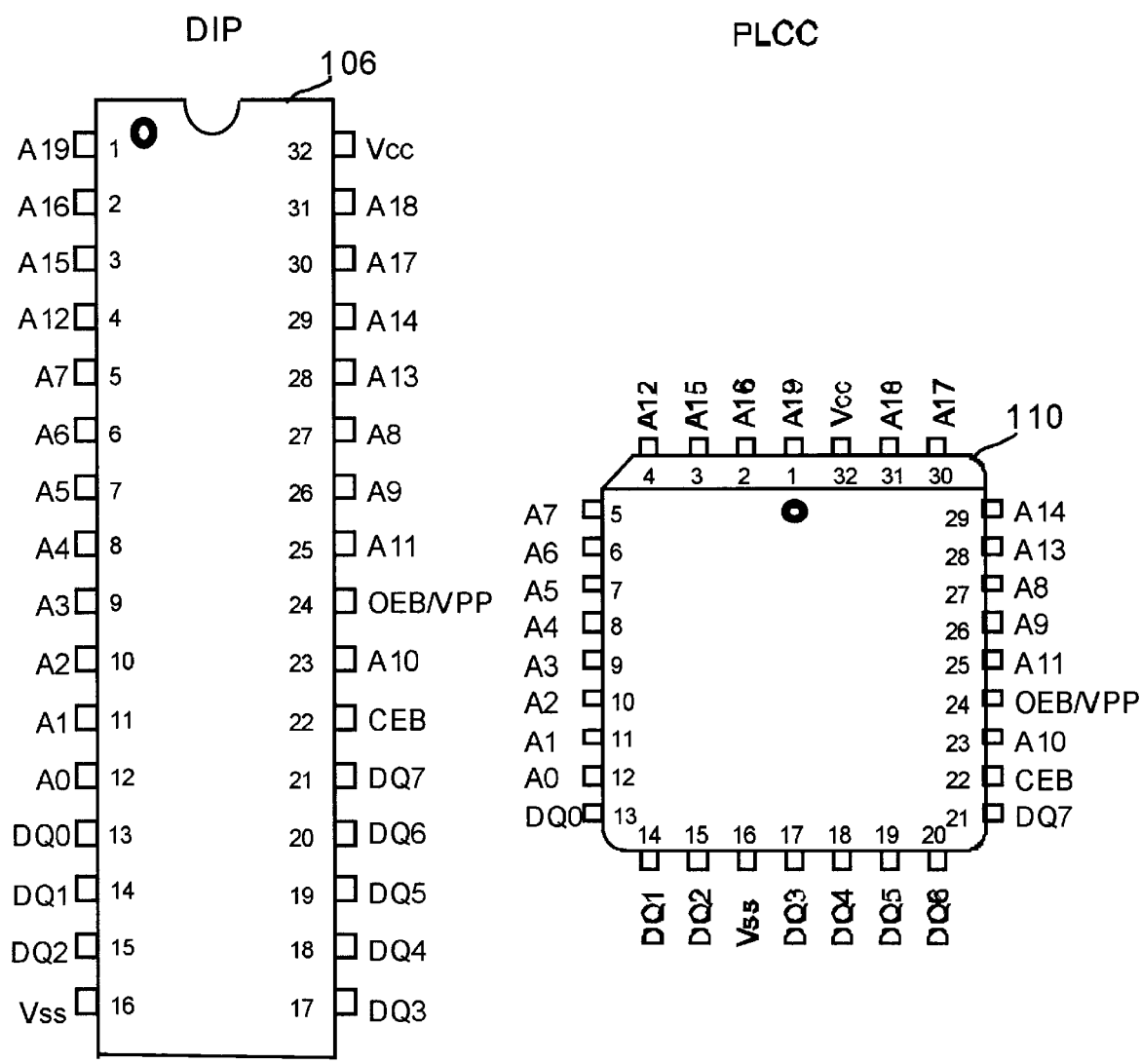
Figure 10:
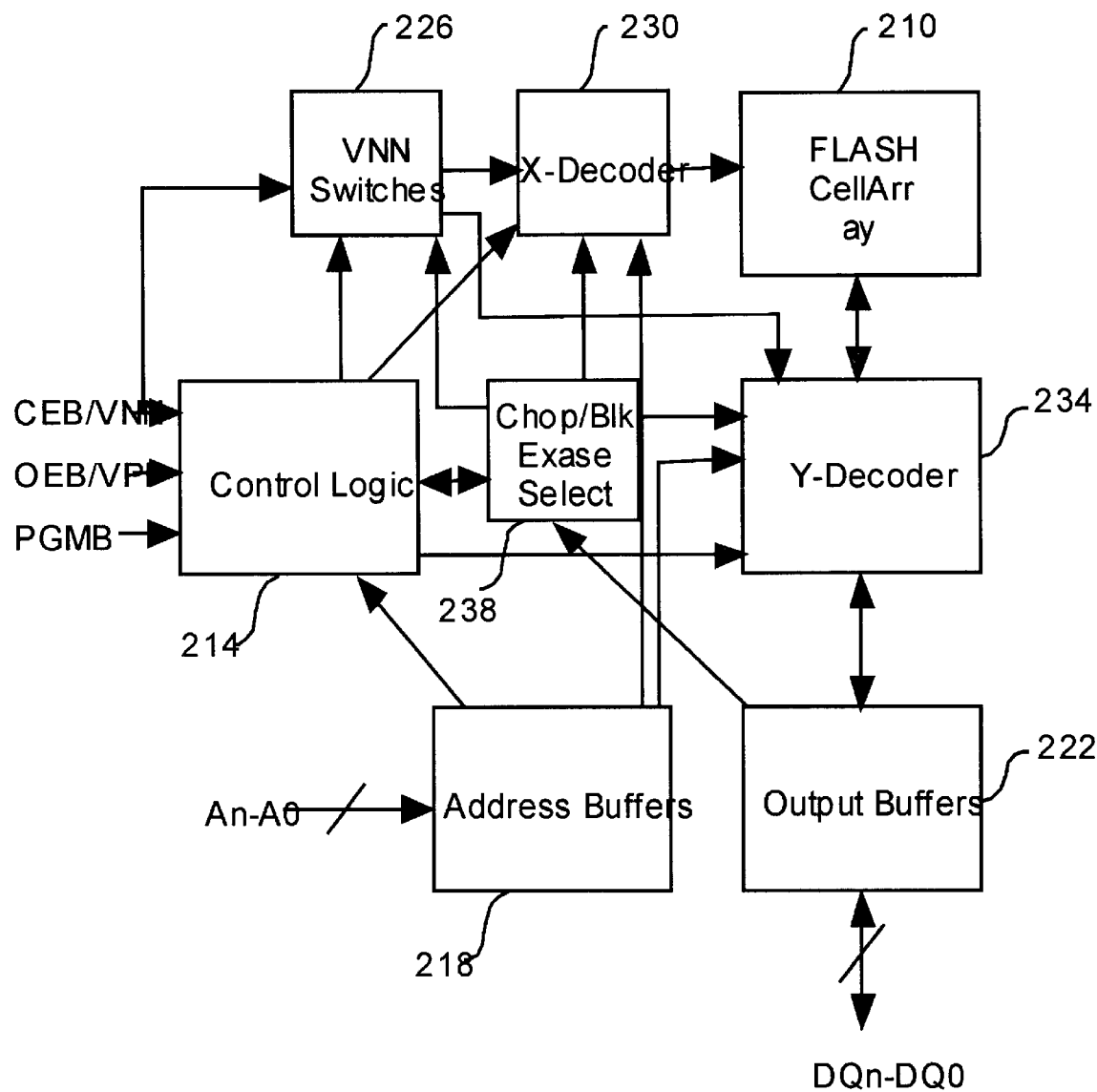
FIG. 10 illustrates the preferred embodiment of the functional block diagram of the MTP EPROM of the present invention.

Referring now to FIG. 10, the preferred embodiment of the MTP EPROM of the present invention is illustrated. A functional block diagram of the MTP EPROM is shown. Several key features of the present invention are illustrated in the block diagram.

As an important feature, a Flash cell array 210 is used for the memory array. The Flash array 210 preferably comprises an array of single transistor cells. The cells require a high voltage, positive programming voltage (VPP) for programming from "1" to "0". The cells also require a high voltage, negative erasing voltage (VNN) for erasing the cells form "0" to "1". During the programming and erasing operation, the voltage threshold ($V_t$) of cells is translated from between a negative value and a positive value depending on charge storage on a floating gate node. The erasing operation causes the $V_t$ to be positive, while the programming operation makes the $V_t$ negative.

The control logic block 214 controls programming, erasing, voltage threshold correction, and read access of the cell array 210. The control logic block 214 uses inputs CEB, OEB, VPP, and PGMB. In addition, the external, negative erasing voltage, VNN, is used. This is an important feature in the present invention. In a typical Flash memory device, the positive and negative high voltage supplies for programming and erasing the cells are generated using on-chip charge pump circuits. In addition, a complex state machine circuit is used to control the mode of operation of the device. In the novel, MTP EPROM of the present invention, however, the positive and negative high voltage supplies, VPP and VNN, are externally sourced. In addition, the complex state machine logic circuit is not needed. Therefore, the MTP EPROM device can be implemented using a Flash memory cell 210 yet still be cost effective.

In the functional block diagram, the OEB and VPP signals are multiplexed. It should be understood that this is an optional feature of the present invention and corresponds to the JEDEC standard of combining OEB and VPP as needed in certain memory densities. In addition, the PGMB is optional depending upon the available pin configuration according to the JEDEC standard.

Of significant importance, the novel MTP EPROM of the present invention multiplexes CEB and VNN signals. This is a significant addition to the JEDEC standard, yet is compatible with existing pin configurations. The assertion level of CEB is $V_{il}$, which is typically between about 0 Volts and 1 Volt. However, the assertion level of VNN is between about –8 Volts and –12 Volts. Therefore, the input logic of the control logic block 214 can distinguish between the assertion of each signal. Finally, the logical operation of the control logic block 214 insures that CEB and VNN are compatible.

The address buffers block 218 controls the selection of particular byte or word elements in the Flash cell array 210. The address buffers block 218 uses the value of the address bus, A[n:0], where A[0] is the lowest bit of the address and An is the highest bit. The address buffers block 218 latches this address and signals the X-Decoder block 230 and the Y-Decoder block 234 to select the appropriate byte or word element during an erase, program, read, or $V_t$ correction function.

An additional important function of the address buffer block 218 is to select the erase option code. In this regard, the value of A[2:0] selects which of eight different parts of the Flash memory array 210 will be erased. Any of blocks 0 through 6 or the entire array may be erased based on the value of A[2:0]. This is an optional feature of the present invention.

The output buffers block 222 provides a link between the contents of the Flash cell array 210 and the data bus, DQ[n:0]. DQ[0] is the lowest bit of the data and DQ[n] is the highest. In byte mode, DQ[n] is DQ[7]. In word mode, DQ[n] is DQ[15]. During a read operation, DQ[n:0] will be driven by the output buffers block 222 to the value of the data at the location selected by the value of the address bus, A[n:0]. During a programming operation, DQ[n:0] is driven by external signals and this value will be written to the location in the Flash cell array 210 selected by the address bus value, A[n:0].

An additional important feature of the MTP EPROM of the present invention is that the signal DQ[7] has an additional function during erase and $V_t$ correction modes. To place the MTP EPROM device into either mode, VPP and VNN are both asserted. The value of DQ[7] then determines which mode is active. If DQ[7] is low, then an erase is performed. If DQ[7] is high, then a $V_t$ correction is performed. The chip/blk erase select block 238 controls the erase moding.

Another important feature of the present invention is the VNN switches block 226. In this block 226, the high voltage signal, VNN, is switched as directed by the control logic block 214. The VNN voltage is presented to the X-Decoder 230 and Y-Decoder 234 for use in erasing or in $V_t$ correction. VNN is used to shut off the leakage current in the cell array 210 during the $V_t$ correction sequence.

The operating modes for the novel MTP EPROM of the present invention may now be discussed. To fully discuss the operating modes of the device, it is necessary to look at several different versions of the device. Referring again to FIGS. 2 through 9, the JEDEC standard configurations vary depending on the size of the memory cell array inside the OTP EPROM. Because of this variation, some device sizes do not include the PGMB pin. This variation is incorporated into the MTP EPROM of the present invention as will be seen in FIGS. 11 through 18. In addition, the novel MTP EPROM may be configured to provide a $V_t$ correction function that alters the entire chip array all at once or that alters only single bytes or words of the chip array. Therefore, it is necessary to review four distinct MTP EPROM device types.

Referring now to Table 1, the mode table for a MTP EPROM without a PGMB pin and with chip-wide $V_t$ correction is shown:

TABLE 1

MTP EPROM Operating Modes, without PGMB, with chip-wide $V_t$ correction.

| Mode | CEB/ VNN | OEB/ VPP | A[n:3] | A[2:0] | DQ[7] | *DQ[6:0] |
|---|---|---|---|---|---|---|
| Read | $V_{il}$ | $V_{il}$ | $A_i$ | $A_i$ | Dout | Dout |
| Program | $V_{il}$ | 10V | $A_i$ | $A_i$ | Din | Din |
| Program Verify | $V_{il}$ | $V_{il}$ | $A_i$ | $A_i$ | Dout | Dout |
| Erase | –10V | 10V | x | Erase option | $V_{il}$ | High Z |

TABLE 1-continued

MTP EPROM Operating Modes, without PGMB, with chip-wide $V_t$ correction.

| Mode | CEB/ VNN | OEB/ VPP | A[n:3] | A[2:0] | DQ[7] | *DQ[6:0] |
|---|---|---|---|---|---|---|
| Erase Verify | −10V | $V_{il}$ | $A_i$ | $A_i$ | Dout | Dout |
| Vt Correct | −10V | 10V | x | x | $V_{ih}$ | High Z |
| Vt Verify | −10V | $V_{il}$ | $A_i$ | $A_i$ | Dout | Dout |

Several items should be noted. First, the read operation and the program verify operation are essentially the same. Second, the erase options discussed above are incorporated into the value of A[2:0]. Third, during an erase operation, both VNN and VPP are asserted. This allows a distinction between an erase and an erase verify or a $V_t$ correction verify. Further, to distinguish between an erase verify and a $V_t$ correction verify, the value of DQ[7] is used. Finally, note that, for each of the mode tables, the value of DQ[6:0] must be extended to DQ[15:8;6:0] if word mode is used instead of byte mode.

Referring now to Table 2, the mode table for a MTP EPROM without a PGMB pin and with bit-by-bit $V_t$ correction is shown:

TABLE 2

MTP EPROM Operating Modes, without PGMB, with bit-by-bit $V_t$ correction.

| Mode | CEB/ VNN | OEB/ VPP | A[n:3] | A[2:0] | DQ[7] | *DQ[6:0] |
|---|---|---|---|---|---|---|
| Read | $V_{il}$ | $V_{il}$ | $A_i$ | $A_i$ | Dout | Dout |
| Program | $V_{il}$ | 10V | $A_i$ | $A_i$ | Din | Din |
| Program Verify | $V_{il}$ | $V_{il}$ | $A_i$ | $A_i$ | Dout | Dout |
| Erase | −10V | 10V | x | Erase option | $V_{il}$ | High Z |
| Erase Verify | −10V | $V_{il}$ | $A_i$ | $A_i$ | Dout | Dout |
| Vt Correct | −10V | 10V | $A_i$ | $A_i$ | $V_{ih}$ | High Z |
| Vt Verify | −10V | $V_{il}$ | $A_i$ | $A_i$ | Dout | Dout |

The only operating difference between a Table 1 MTP EPROM device and a Table 2 device is during $V_t$ correction. Since the Table 2 device provides a bit-by-bit correction, the value, $A_i$, of the address bus A[n:0] is used to determine the location in the memory array that receives correction.

Referring now to Table 3, the mode table for a MTP EPROM with a PGMB pin and with chip-wide, $V_t$ correction is shown:

TABLE 3

MTP EPROM Operating Modes, with PGMB, with chip wide, $V_t$ correction.

| Mode | CEB/ VNN | OEB/ VPP | A[n:3] | A[2:0] | PGMB | DQ[7] | *DQ [6:0] |
|---|---|---|---|---|---|---|---|
| Read | $V_{il}$ | $V_{il}$ | $A_i$ | $A_i$ | $V_{ih}$ | Dout | Dout |
| Program | $V_{ih}$ | 10V | $A_i$ | $A_i$ | $V_{il}$ | Din | Din |
| Program Verify | $V_{il}$ | $V_{il}$ | $A_i$ | $A_i$ | $V_{ih}$ | Dout | Dout |

TABLE 3-continued

MTP EPROM Operating Modes, with PGMB, with chip wide, $V_t$ correction.

| Mode | CEB/ VNN | OEB/ VPP | A[n:3] | A[2:0] | PGMB | DQ[7] | *DQ [6:0] |
|---|---|---|---|---|---|---|---|
| Erase | −10V | 10V | x | Erase option | $V_{il}$ | $V_{il}$ | High Z |
| Erase Verify | −10V | $V_{il}$ | x | x | $V_{ih}$ | Dout | Dout |
| Vt Correct | −10V | 10V | $A_i$ | $A_i$ | $V_{il}$ | $V_{ih}$ | High Z |
| Vt Verify | −10V | $V_{il}$ | $A_i$ | $A_i$ | $V_{ih}$ | Dout | Dout |

The operation of a Table 3 MTP EPROM device is the same as that of a Table 1 device except for two differences. First, the PGMB signal must be driven during each mode. Basically, PGMB is asserted during any operation that affects the state of the memory cells, such as, programming, erasing, and $V_t$ correction. PGMB is not asserted during reading operations, such as, read, program verify, erase verify, and correction verify. Second, during program mode, CEB must be de-asserted.

Referring now to Table 4, the mode table for a MTP EPROM with a PGMB pin and with bit-by-bit, $V_t$ correction is shown:

TABLE 4

MTP EPROM Operating Modes, with PGMB, with bit-by-bit, $V_t$ correction.

| Mode | CEB/ VNN | OEB/ VPP | A[n:3] | A[2:0] | PGMB | DQ[7] | *DQ [6:0] |
|---|---|---|---|---|---|---|---|
| Read | $V_{il}$ | $V_{il}$ | $A_i$ | $A_I$ | $V_{ih}$ | Dout | Dout |
| Program | $V_{ih}$ | 10V | $A_i$ | $A_I$ | $V_{il}$ | Din | Din |
| Program Verify | $V_{il}$ | $V_{il}$ | $A_i$ | $A_I$ | $V_{ih}$ | Dout | Dout |
| Erase | −10V | 10V | x | Erase option | $V_{il}$ | $V_{il}$ | High Z |
| Erase Verify | −10V | $V_{il}$ | $A_i$ | $A_I$ | $V_{ih}$ | Dout | Dout |
| Vt Correct | −10V | 10V | $A_i$ | $A_I$ | $V_{il}$ | $V_{ih}$ | High Z |
| Vt Verify | −10V | $V_{il}$ | $A_i$ | $A_I$ | $V_{ih}$ | Dout | Dout |

The operation of a Table 4 MTP EPROM device is the same as that of a Table 2 device except for two differences. First, the PGMB signal must be driven during each mode. Basically, PGMB is asserted during any operation that affects the state of the memory cells, such as, programming, erasing, and $V_t$ correction. PGMB is not asserted during reading operations, such as, read, program verify, erase verify, and correction verify. Second, during program mode, CEB must be de-asserted.

Finally, referring now to Table 5, an erase option codes table is shown. The erase operation may be applied selectively to the memory cell as shown.

TABLE 5

Erase option codes for MTP EPROM

| Erase Option | A[2:0] |
|---|---|
| Chip | 000 |
| Block 0 | 001 |
| Block 1 | 010 |
| Block 2 | 011 |
| Block 3 | 100 |
| Block 4 | 101 |
| Block 5 | 110 |
| Block 6 | 111 |

Figure 11:
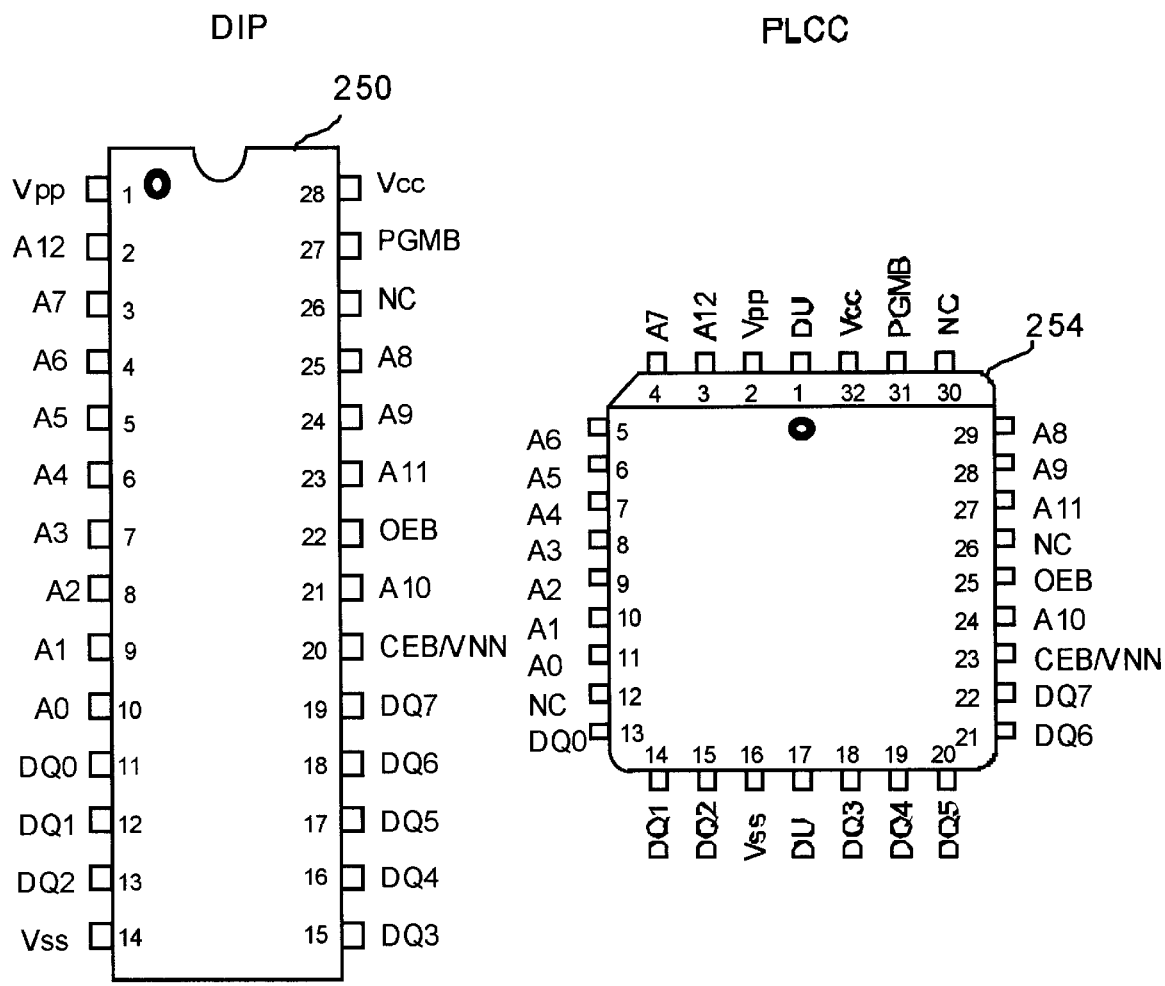
FIGS. 11 through 18 illustrate the preferred embodiment pin configurations for MTP EPROM devices in DIP and PLCC packages at memory sizes between 64 kilobits and 8 megabits. These pin configurations add the external, negative erasing voltage (VNN) pin, yet still conformed to, and are compatible with, existing JEDEC standard pin configurations.
Figure 12:
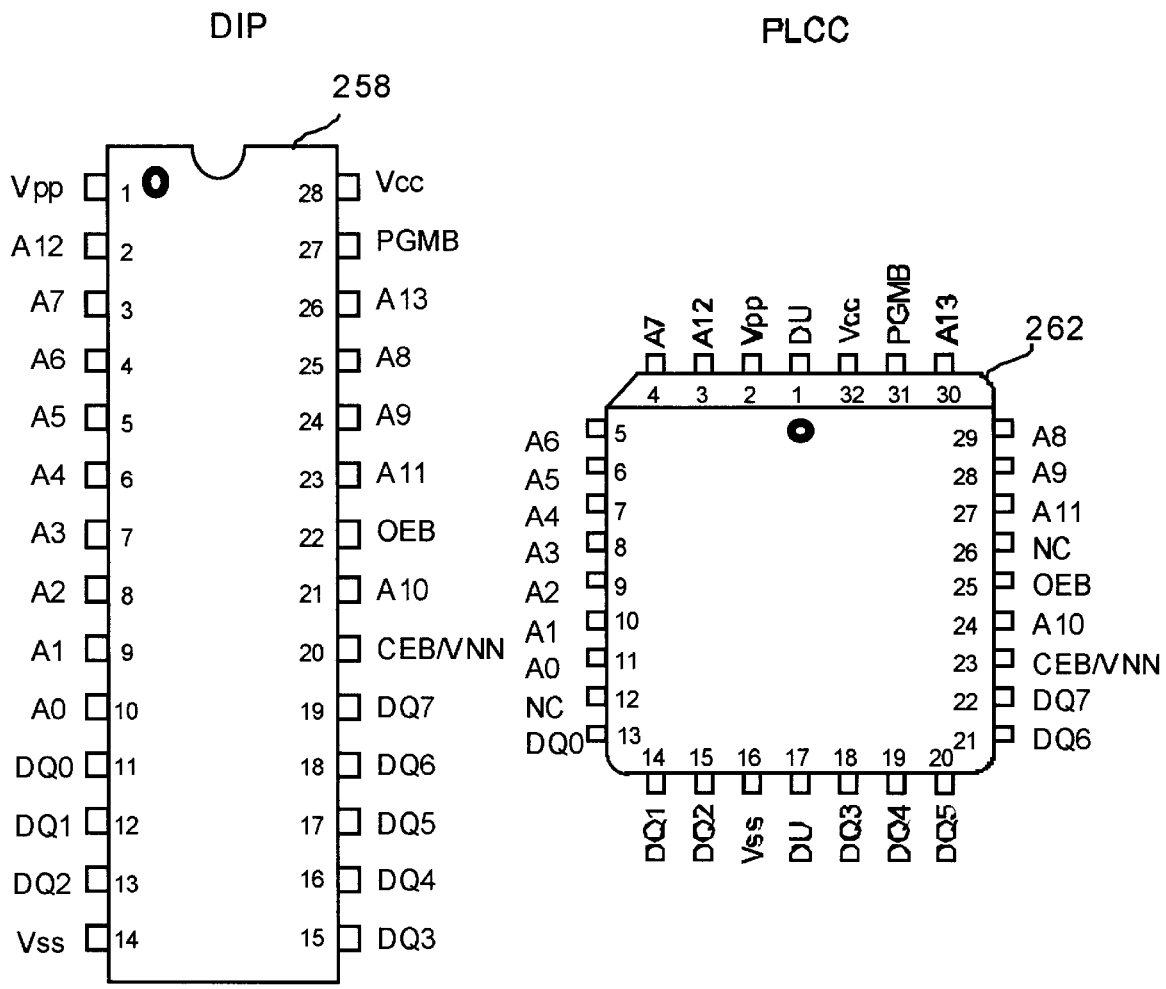

Referring now to FIGS. 11 through 18, the preferred embodiment pin configurations for MTP EPROM devices in DIP and PLCC packages at memory sizes between 64 kilobits and 8 megabits are illustrated. These pin configurations add the external, negative erasing voltage (VNN) pin, yet still conformed to, and are compatible with, existing JEDEC standard pin configurations. Referring particularly to FIG. 11, the MTP EPROM configurations for a 64 kilobit part are shown. The DIP package 250 is a 28-pin part. The PLCC package 254 is a 32-pin part. An important feature is that the CEB pin and the VNN pin are multiplexed together. Note that the VPP signal has a separate pin from the OEB signal. In addition, the PGMB signal is available. Referring to FIG. 12, a 128 kilobit part is shown. Again, CEB and VNN are combined, VPP is separate from OEB ,and PGMB is available.

Figure 13:
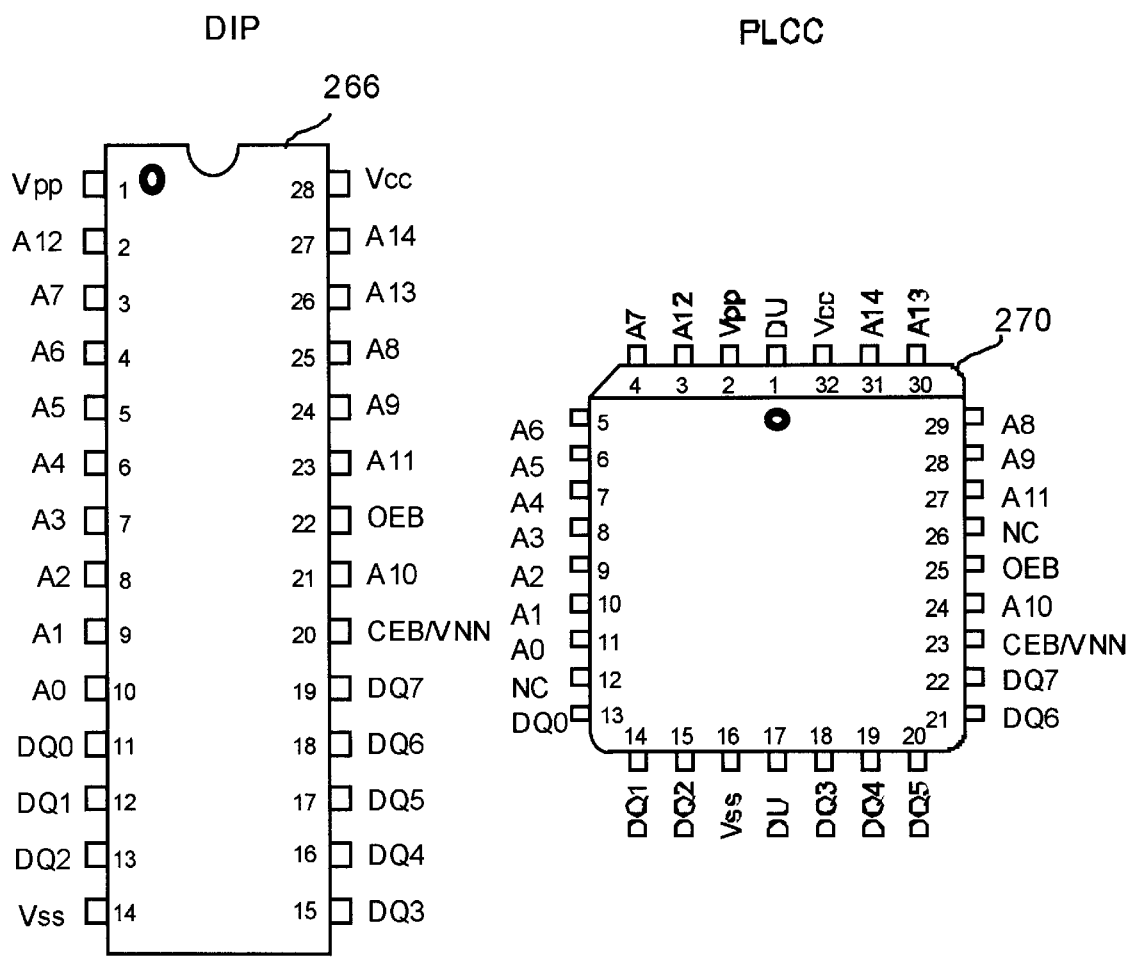
Figure 14:
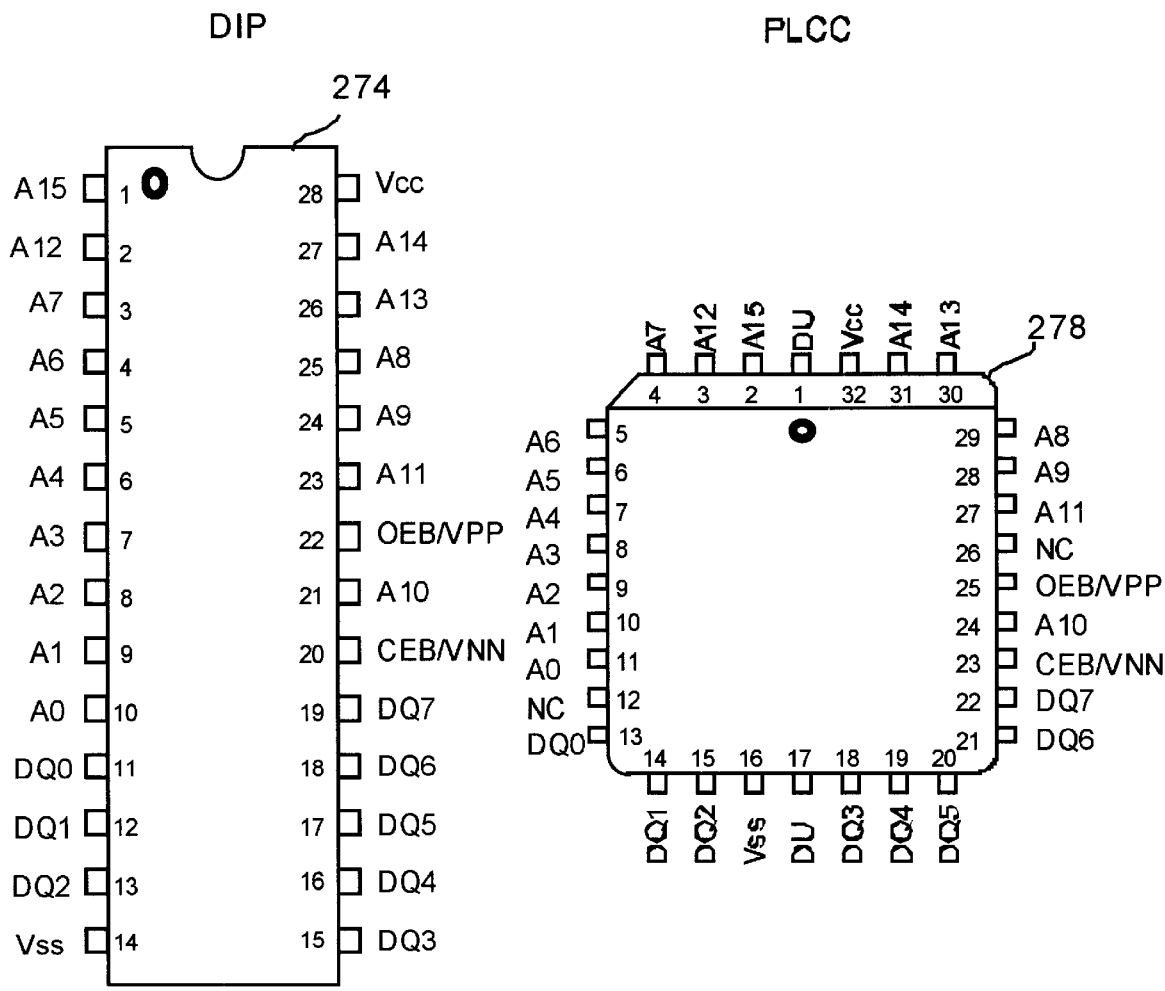

Referring now to FIG. 13, the 256 kilobit part is shown. The key difference at this density is the loss of the PGMB pin. The CEB and VNN pins are combined. Referring now to FIG. 14, the 512 kilobit part is shown. At this density, the JEDEC standard configuration moves the VPP signal to the same pin as the OEB signal. Therefore, VPP and OEB are multiplexed together. CEB and VNN are combined.

Figure 15:
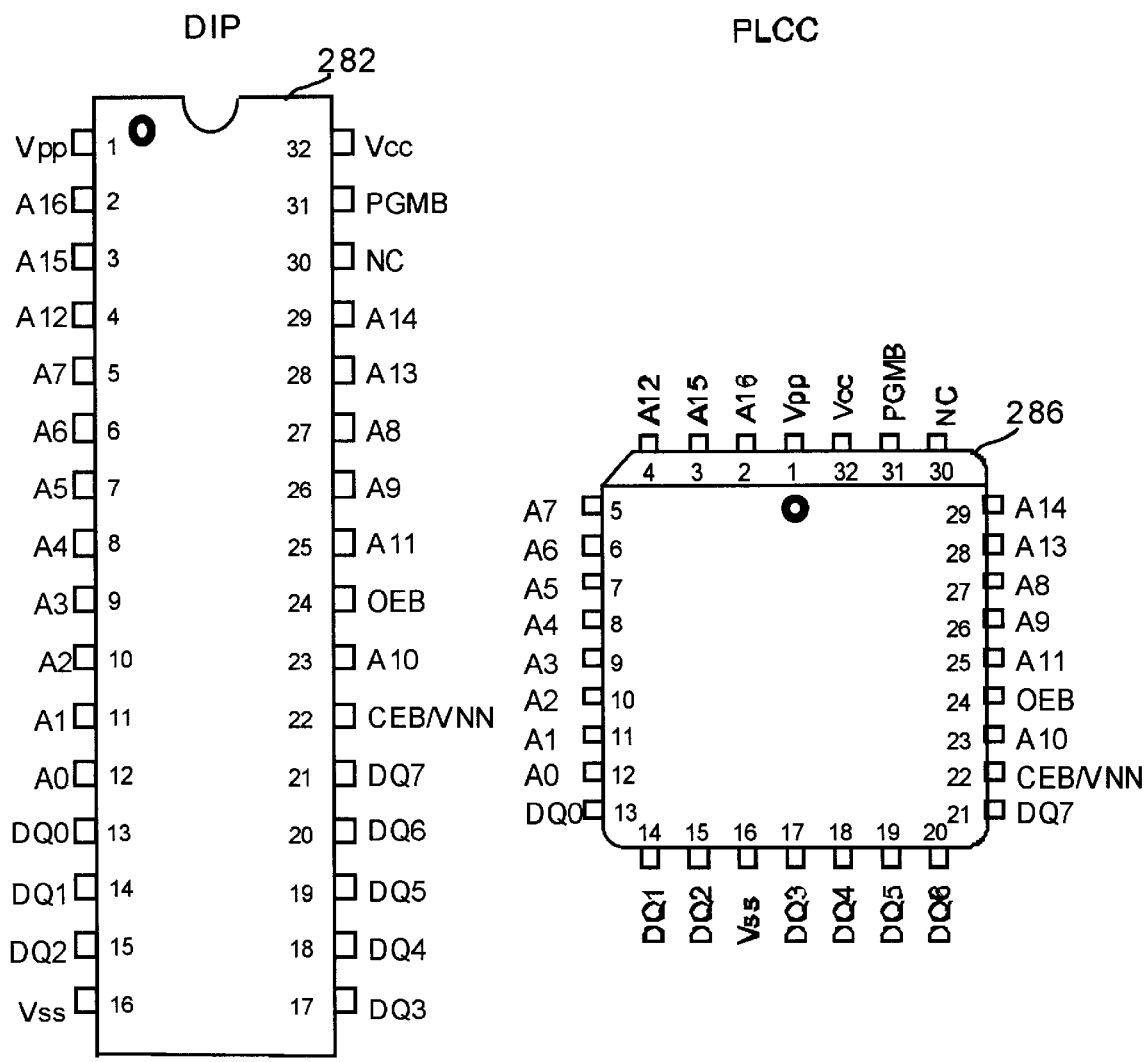
Figure 16:
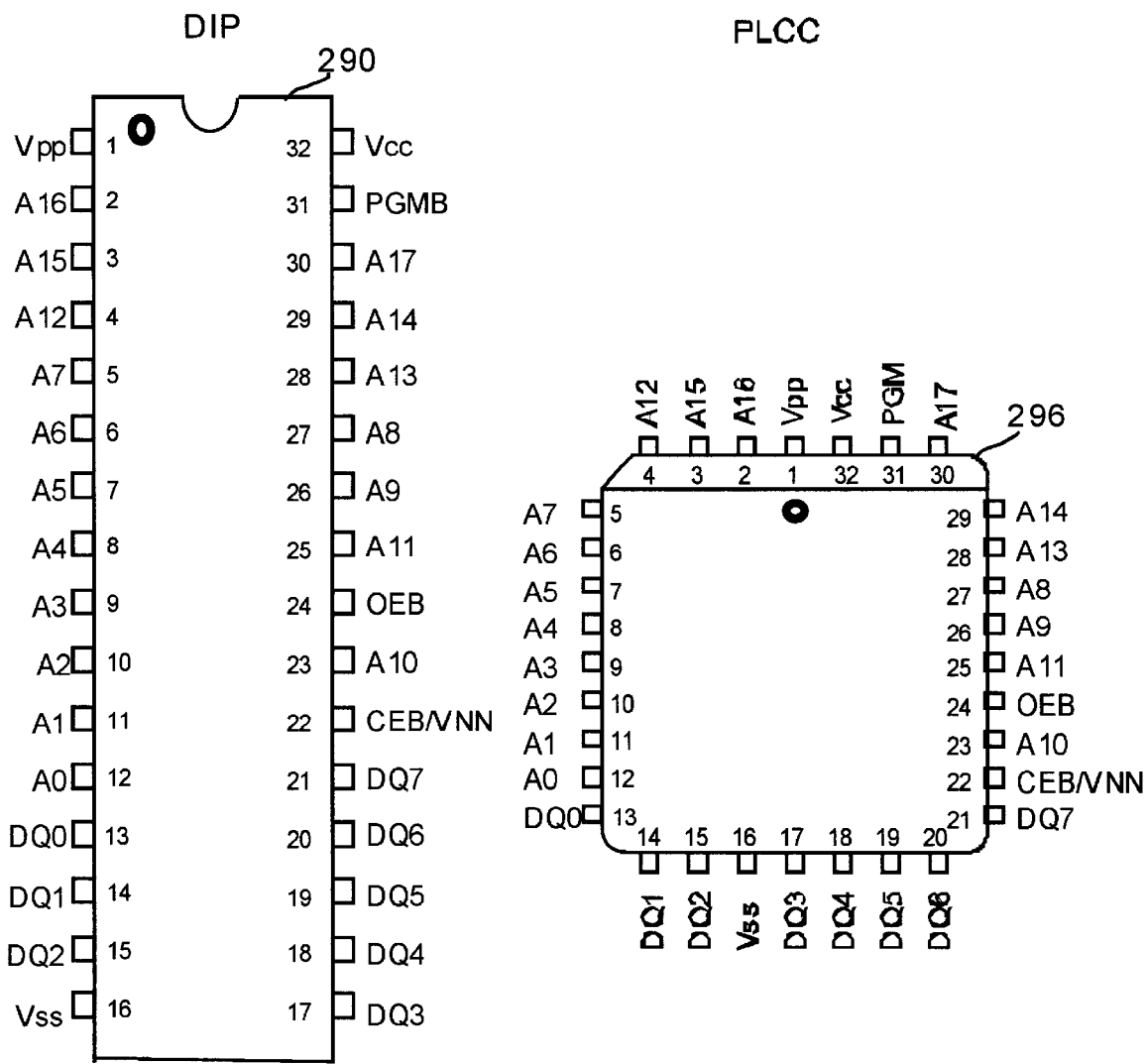

Referring now to FIG. 15, the 1 megabit EPROM device is shown. The DIP part 282 pin count increases to 32 pins. The PLCC package 286 remains at 32 pins. With the extra pins, the 1 megabit device provides separate VPP and OEB pins as well as a PGMB pin. However, the CEB and VNN signals are combined. Referring now to FIG. 16, the 2 megabit EPROM device also provides separate VPP and OEB pins and a PGMB pin. The CEB and VNN signals are combined.

Figure 17:
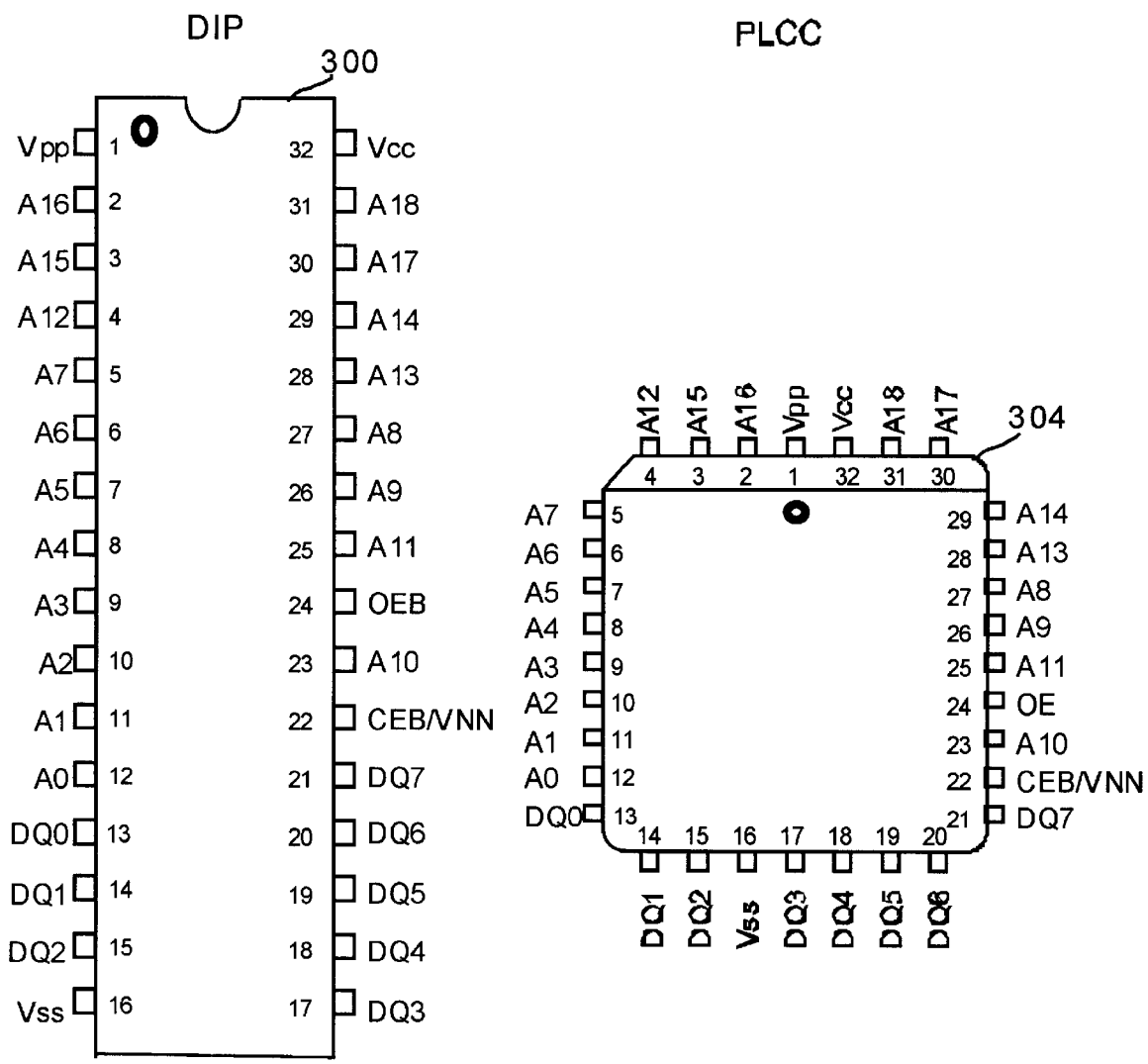
Figure 18:
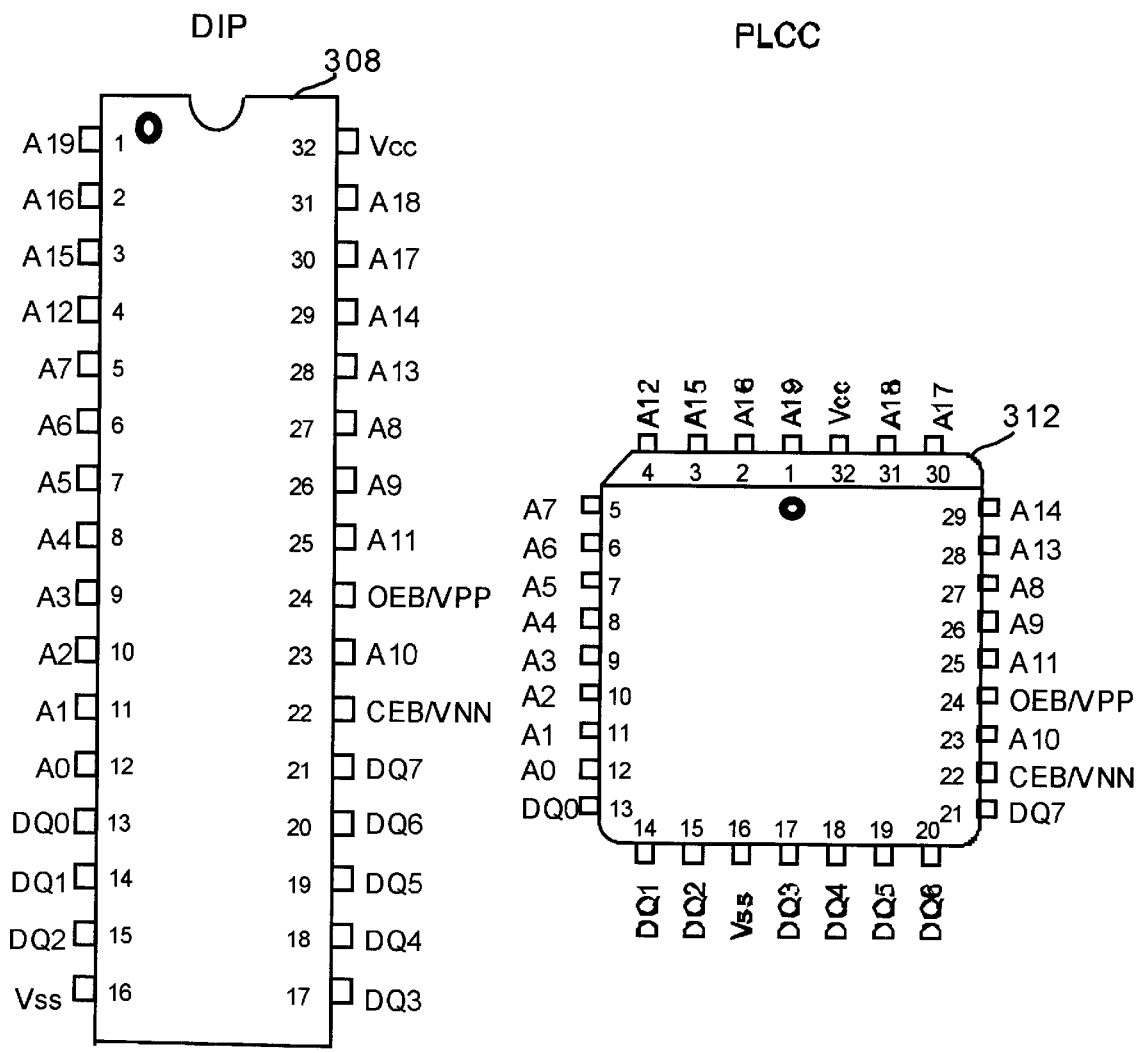

Referring now to FIG. 17, the 4 megabit OTP EPROM removes the PGMB pin. The CEB and VNN signals are combined. Finally, referring to FIG. 18, the 8 megabit EPROM combines VPP and OEB as a multiplexed pin. The CEB and VNN signals are combined.

Figure 19:
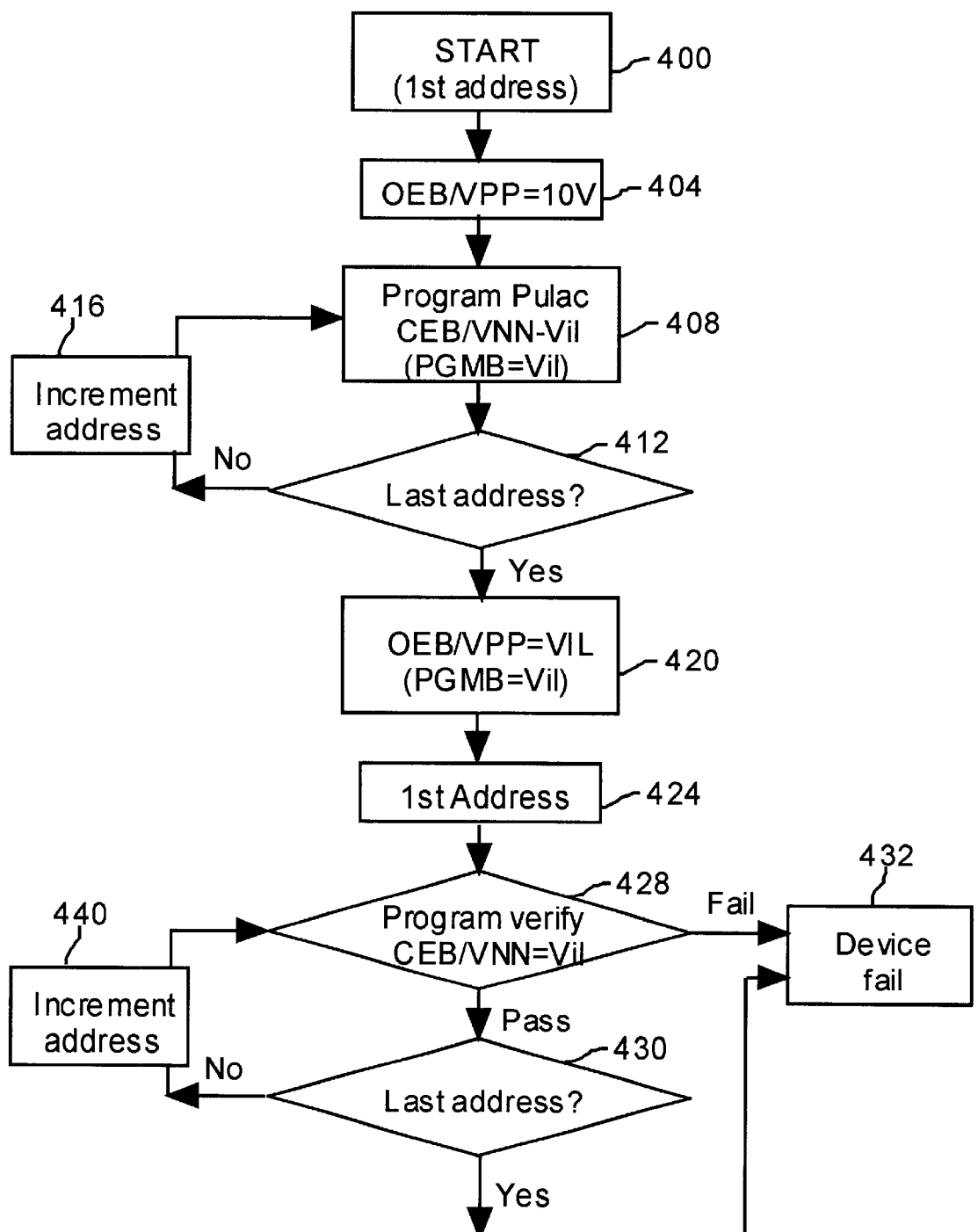
FIGS. 19 and 20 illustrate a preferred embodiment of an erasure algorithm for the MTP EPROM of the present invention.
Figure 20:
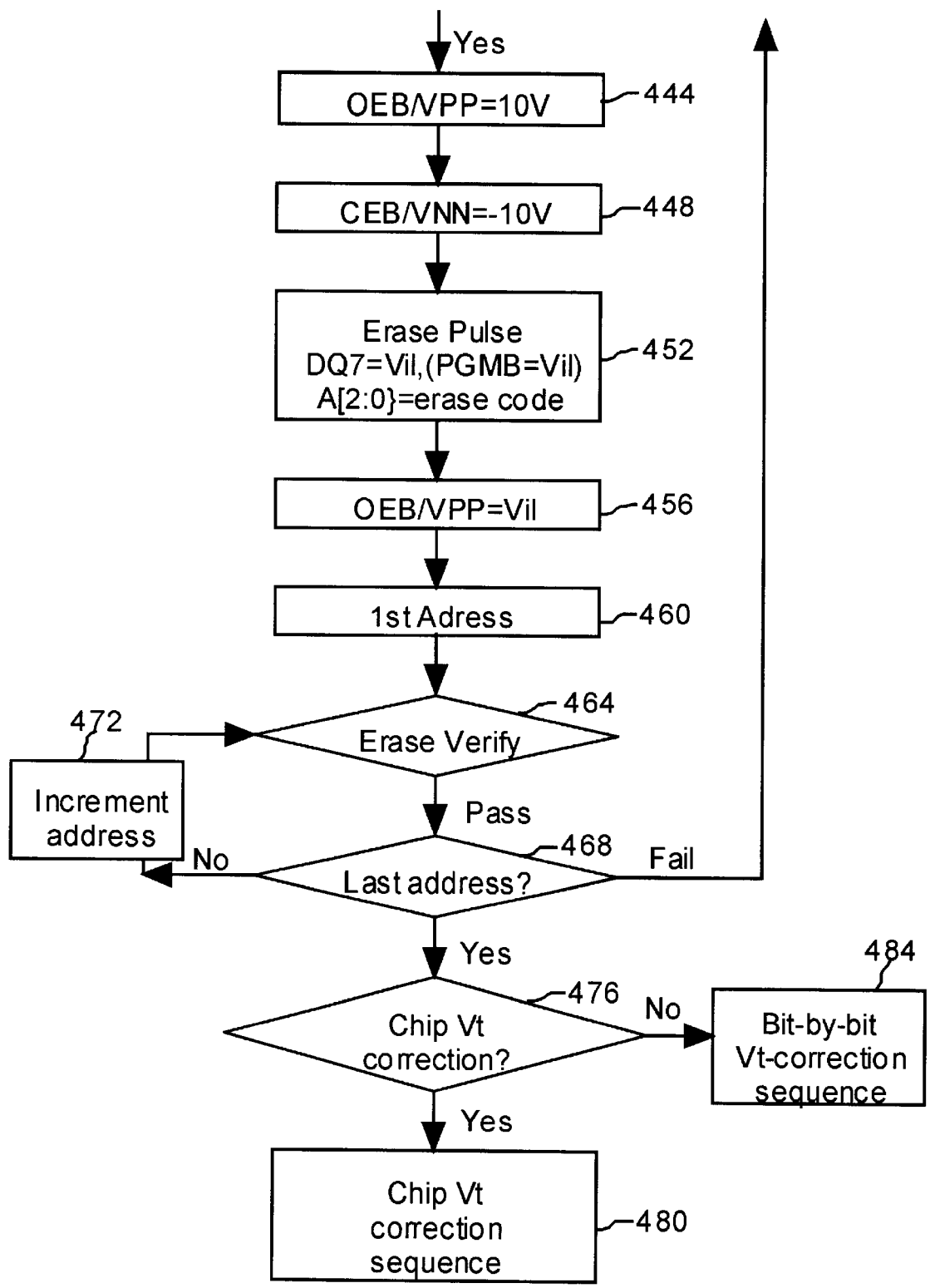
Figure 21:
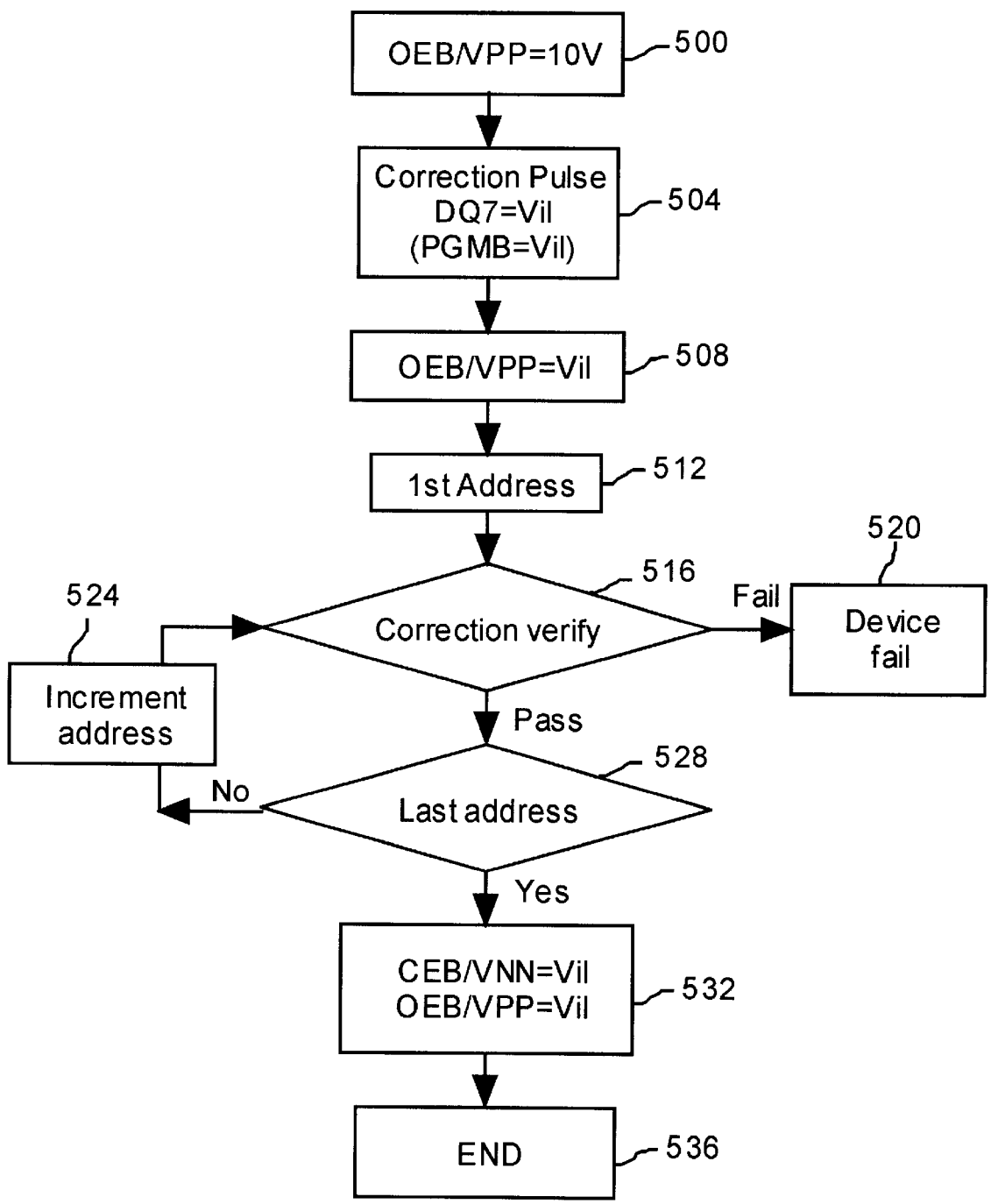
FIG. 21 illustrates a preferred embodiment of a chip-wide voltage threshold ($V_t$) correction algorithm for the MTP EPROM of the present invention.

Referring now to FIGS. 19 through 23, preferred embodiments of several key algorithms are illustrated. These novel algorithms are applied to the novel, MTP EPROM device of the present invention to actuate erasing, programming, and $V_t$ correction. Referring now to FIGS. 19 and 20, the MTP EPROM Erase Algorithm is shown.

Referring more particularly to FIG. 19, a first part of the erase method is shown. In summary, the MTP EPROM is first programmed and then the programmed data is verified. The method comprises, first, forcing the address bus of the device to an address value equal to a starting address in step 400. The external, positive programming voltage (VPP) pin is then asserted in step 404. Finally, a sequence of memory cell locations are programmed in steps 408, 412, and 416. The programming comprises, first, forcing the data bus of the device to a selected value. The chip enable bar (CEB) pin is then asserted, preferably by a pulse, to thereby write the selected value to the selected address of the memory cell array in step 408. The chip enable bar (CEB) pin is de-asserted at the end of the pulse. If PGMB is used on the device, then PGMB is asserted instead of the CEB pulse. Finally, the address value is tested in step 412. The address value is incremented and the reading sequence is repeated if less than a final value in step 416. The reading sequence ends if equal to the final value.

The MTP EPROM memory array programming is then verified. The programming verification method comprises steps 420, 424, 428, 432, 436, and 440. First, the output enable bar (OEB) signal is asserted in step 420. The address bus of the device is then forced to an address value equal to a starting address in step 424. Finally, a sequence of memory cell locations is read in steps 428, 432, 436, and 440. The reading sequence comprises, first, asserting the chip enable bar (CEB) pin to read a data value at the address value in step 428. If the data is not correct, a device failure is set in step 432. The address value is then tested in step 436. The address value is incremented and the reading sequence is repeated if less than a final value in step 440. The reading sequence ends if equal to the final value.

Referring now to FIG. 20, the second half of the erase algorithm is illustrated. The method comprises, first, asserting the external, negative erasing voltage (VNN) pin and the external, positive programming voltage (VPP) pin in steps 444 and 448. Next, the address bus of the device is forced to a selected address to thereby selectively erase a part of the memory cell array in step 452. The erased part may comprise either a single memory array block or the whole memory array depending on the value of A[2:0] as discussed above and shown in Table 5. The DQ[7] pin is set to $V_{il}$ to distinguish the erase function from a $V_t$ correction function. Finally, if PGMB is used, it will be asserted during the erase function.

Following the bulk erase function, the erase may be verified as shown in steps 456, 460, 464, 468, and 472. The method comprises, first, asserting the external, negative erasing voltage (VNN) pin as is performed in the prior step 444. The output enable bar (OEB) signal is asserted in step 456. The address bus of the device is forced to an address value equal to a starting address in step 460. A sequence of memory cell locations is read in steps 464, 468, and 472. The reading sequence comprises, first, asserting the chip enable bar (CEB) signal to read a data value at the address value to thereby verify that the selected address is erased in step 464. If the value is not erased, a device failure is noted in step 432. The address value is tested in step 468. The address value is incremented and the reading sequence is repeated if less than a final value in step 472. The reading sequence ends if equal to the final value.

Following the erase verification, a $V_t$ correction sequence may then be performed as in shown in steps 476, 480, and 484. If the $V_t$ correction is performed, the type of correction available is checked in step 476. If a chip-wide correction is available on the device, then step 480 is performed. If a bit-by-bit correction is available on the device, then a bit-by-bit correction is performed as in step 484. The chip-wide $V_t$ correction method is shown in detail in FIG. 21. The bit-by-bit $V_t$ correction method is shown in FIG. 22.

Referring again to FIG. 21, a preferred embodiment of a chip-wide voltage threshold ($V_t$) correction algorithm for the MTP EPROM of the present invention is illustrated. The method comprises, first, asserting the external, positive programming voltage (VPP) pin in step 500. The external, negative erasing voltage (VNN) pin remains asserted as in FIG. 20. Finally, a correction select pin is asserted to thereby cause the threshold correction of the whole memory array in step 504. In the preferred embodiment, the correction select pin is a data bus pin of the device, and more preferably, the DQ[7] pin as shown in Tables 1 through 4. If PGMB is used on the device, then PGMB is asserted during the correction select pin pulse.

The threshold correction may be verified by the method shown in the remaining steps, 508, 512, 516, 520, 524, 528, 532, and 536. More particularly, the method to verify correction comprises, first, insuring that the external, negative erasing voltage (VNN) pin remains asserted. Output enable bar (OEB) is then asserted in step 508. The address bus of the device is forced to an address value equal to a starting address in step 512. A sequence of memory cell locations is read in steps 516, 420, 524, and 528. The reading sequence comprises, first, asserting the chip enable bar (CEB) pin to read a data value at the address value to thereby verify that the selected address is corrected in step 516. Device failures are flagged in step 520. Finally, the address value is tested in step 528. The address value is incremented and the reading sequence is repeated if less than a final value in step 524. The reading sequence ends if equal to said final value. Following the verification, CEB/VNN, OEB, and VPP are all de-asserted in step 532, and the verification ends in step 536.

Figure 22:
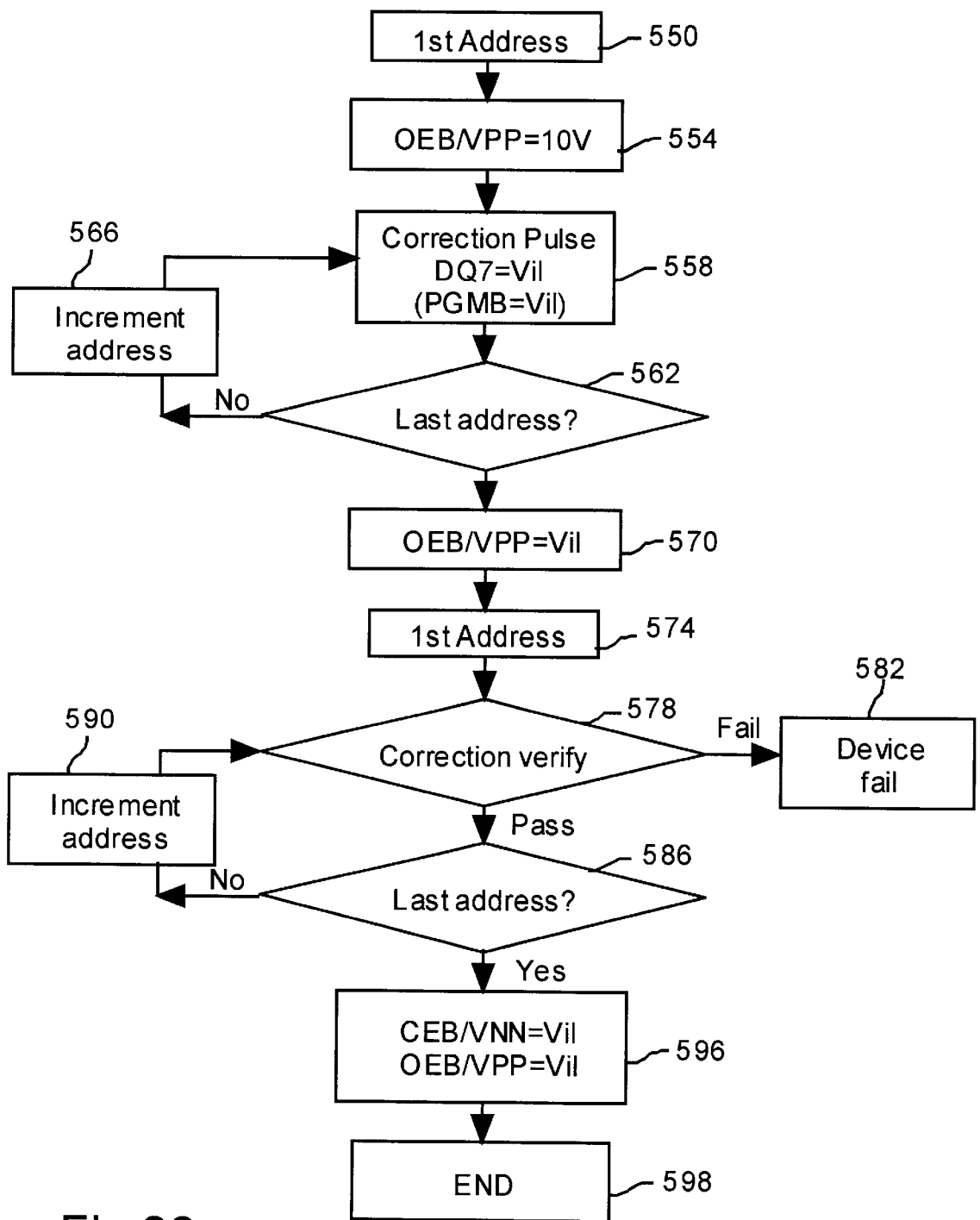
FIG. 22 illustrates a preferred embodiment of a bit-by-bit voltage threshold ($V_t$) correction algorithm for the MTP EPROM of the present invention.
Figure 23:
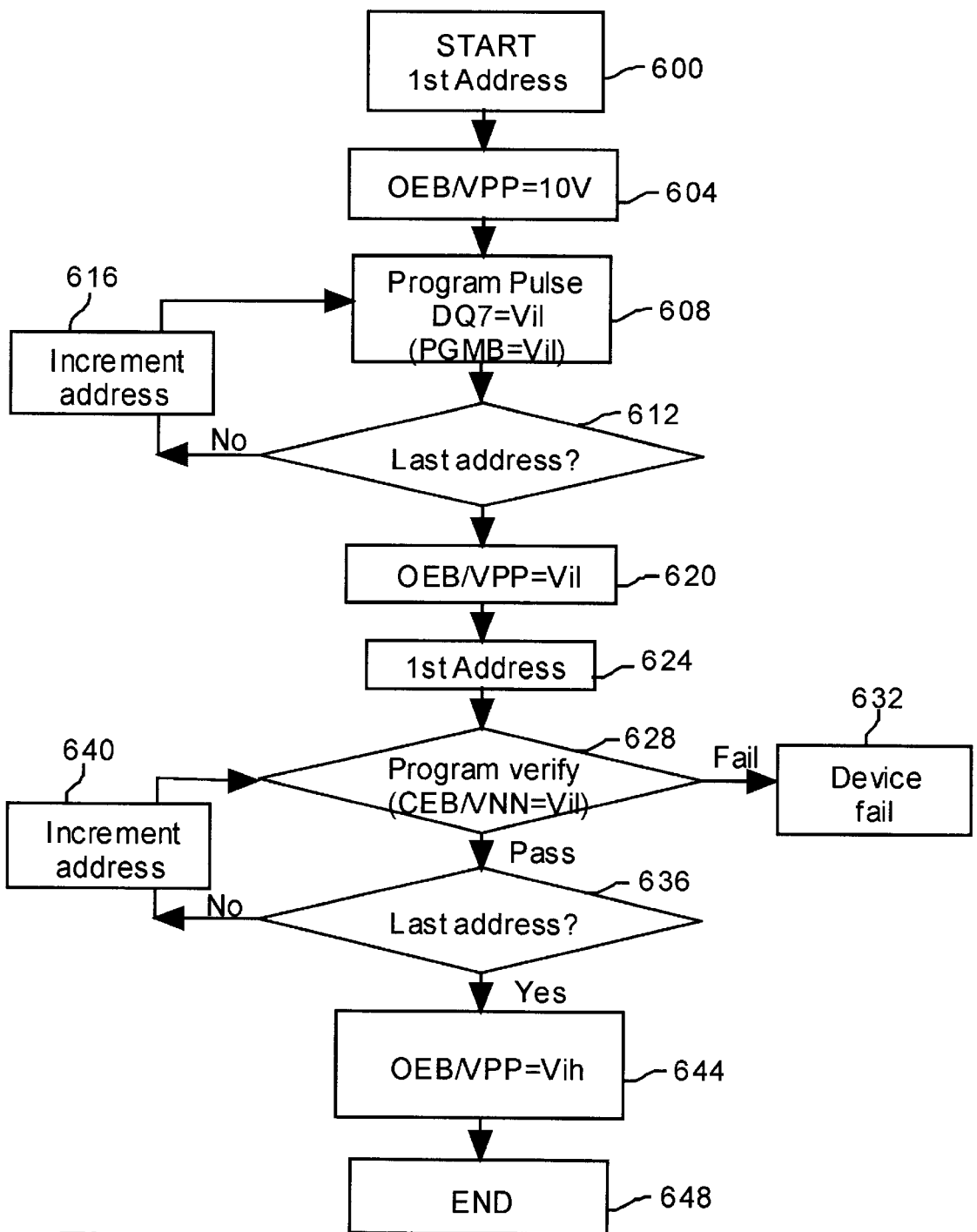
FIG. 23 illustrates a preferred embodiment of a programming algorithm for the MTP EPROM of the present invention.

Referring now to FIG. 22, a preferred embodiment of a bit-by-bit voltage threshold ($V_t$) correction algorithm for the MTP EPROM of the present invention is illustrated. In this method, individual bits of the Flash memory cell may be $V_t$-corrected. The correction method comprises steps 550, 554, 558, 562, and 566. More particularly, The method comprises, first, ensuring that the external, negative erasing voltage (VNN) pin remains asserted as shown in FIG. 20. The address bus of the device is forced to an address value equal to a starting address in step 550. The external, positive programming voltage (VPP) pin is asserted in step 554. Finally, a sequence of memory cell locations is threshold corrected in steps 558, 562 and 566. The threshold correcting comprises, first, asserting a correction select pin, preferably comprising DQ[7], to threshold correct the address value in the memory cell array in step 558. The correction select pin is then de-asserted. If PGMB is used on the device, then PGMB is asserted during the correction select pin pulse. Finally, the address value is tested in step 562. The address value is incremented and the threshold correcting sequence is repeated if less than a final value in step 566. The threshold correcting sequence ends if equal to the final value.

Following the bit-by-bit threshold correction, the threshold correction may be verified using the method of the remaining steps, 570, 574, 578, 582, 586, 590, 596, and 598. More particularly, the method to verify correction comprises, first, ensuring that the external, negative erasing voltage (VNN) pin remains asserted as in FIG. 20, step 448. The output enable bar (OEB) is asserted in step 570. The address bus of the device is forced to an address value equal to a starting address in step 574. A sequence of memory cell locations is read in steps 578, 582, 586, and 590. More particularly, the reading sequence comprises, first, asserting the chip enable bar (CEB) pin to read a data value at the address value to thereby verify that the selected address is corrected in step 578. Device failure is tracked in step 582. The address value is tested in step 586. The address value is incremented and the reading sequence is repeated if less than a final value in step 590. The reading sequence ends if equal to the final value. CEB/VNN, OEB, and VPP are de-asserted in step 596. The sequence ends in step 598.

Referring now to FIG. 123, an MTP EPROM programming method is shown. In summary, the MTP EPROM is first programmed in steps 600, 604, 608, 612, and 616. The programmed data is verified in steps 620, 624, 628, 632, 636, 640, 644, and 648. The method comprises, first, forcing the address bus of the device to an address value equal to a starting address in step 600. The external, positive programming voltage (VPP) pin is then asserted in step 604. Finally, a sequence of memory cell locations is programmed in steps 608, 612, and 616. The programming comprises, first, forcing data pins of the device to a selected value. The chip enable bar (CEB) pin is then asserted, preferably by a pulse, to thereby write the selected value to the selected address of the memory cell array in step 608. The chip enable bar (CEB) pin is de-asserted at the end of the pulse. If PGMB is used on the device, then PGMB is asserted instead of the CEB pulse. Finally, the address value is tested in step 612. The address value is incremented and the reading sequence is repeated if less than a final value in step 616. The reading sequence ends if equal to the final value.

The MTP EPROM memory array programming is then verified. The programming verification method comprises steps 620, 624, 628, 632, 636, and 640. First, the output enable bar (OEB) signal is asserted in step 620. The address bus of the device is then forced to an address value equal to a starting address in step 624. Finally, a sequence of memory cell locations is read in steps 628, 632, 636, and 640. The reading sequence comprises, first, asserting the chip enable bar (CEB) pin to read a data value at the address value in step 628. If the data is not correct, a device failure is in step 632. The address value is then tested in step 636. The address value is incremented and the reading sequence is repeated if less than a final value in step 640. The reading sequence ends if equal to the final value. OEB and VPP are de-asserted in step 644. The method ends in step 648.

The present invention provides an effective, and very manufacturable, multiple time programmable (MTP) EPROM device conforming to JEDEC EPROM pin configuration standards. An MTP EPROM is achieved using a Flash memory cell array. Further, cost is reduced by eliminating the internal charge pumps and state machine. An external, negative erasing voltage (VNN) pin is used, instead. This external, negative erasing voltage (VNN) pin is multiplexed with an existing pin. A threshold voltage ($V_t$) correction capability is provided. Methods for erasing, programming, and correcting the threshold voltage ($V_t$) of a MTP EPROM are achieved.

As shown in the preferred embodiments, the novel non-linear MTP EPROM device provides an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A multiple time programmable memory device comprising:
   a memory cell array including a means of electrical erasability and electrical programmability;
   a package having an external pin configuration that conforms to the JEDEC standard for an EPROM device wherein an external, positive programming voltage (VPP) pin is provided; and
   an external, negative erasing voltage (VNN) pin.

2. The device according to claim 1 wherein said memory cell array comprises Flash memory cells.

3. The device according to claim 1 wherein said external, negative erasing voltage (VNN) is multiplexed with a chip enable bar (CEB) pin.

4. The device according to claim 1 wherein said external pin configuration further comprises a program enable bar (PGMB) pin.

5. The device according to claim 1 wherein said package comprises a dual in-line (DIP) package, wherein said external, negative erasing voltage (VNN) is multiplexed with a chip enable bar (CEB) pin, and wherein said external pin configuration further consists of one of the group of: JEDEC standard 64 kilobit configuration, JEDEC standard 128 kilobit configuration, JEDEC standard 256 kilobit configuration, JEDEC standard 512 kilobit configuration, JEDEC standard 1 megabit configuration, JEDEC standard 2 megabit configuration, JEDEC standard 4 megabit configuration, and JEDEC standard 8 megabit configuration.

6. The device according to claim 1 wherein said package comprises a plastic-leaded chip-carrier (PLCC) package, wherein said external, negative erasing voltage (VNN) is multiplexed with a chip enable bar (CEB) pin, and wherein said external pin configuration further consists of one of the group of: JEDEC standard 64 kilobit configuration, JEDEC standard 128 kilobit configuration, JEDEC standard 256 kilobit configuration, JEDEC standard 512 kilobit configuration, JEDEC standard 1 megabit configuration, JEDEC standard 2 megabit configuration, JEDEC standard 4 megabit configuration, and JEDEC standard 8 megabit configuration.

7. The device according to claim 1 wherein said means of electrical erasability comprises:
asserting said external, negative erasing voltage (VNN) pin; and
asserting said external, positive programming voltage (VPP) pin to thereby clear said memory cell array.

8. The device according to claim 7 further comprising a means of selectively erasing parts of said memory cell array depending on an address value input to said device.

9. The device according to claim 1 further comprising a means to verify erasure of a selected address of said memory cell comprising:
asserting said external, negative erasing voltage (VNN) pin;
asserting an output enable bar (OEB) pin;
forcing address bus of said device to a selected address; and
reading data bus of said device to thereby verify that said selected address is erased.

10. The device according to claim 1 wherein said means of electrical programmability comprises:
asserting said external, positive programming voltage (VPP) pin;
asserting said chip enable bar (CEB);
forcing address bus of said device to a selected address; and
forcing data bus of said device to a selected value to thereby write said selected value to said selected address of said memory cell array.

11. The device according to claim 1 further comprising a means to correct threshold voltage ($V_t$) values of said memory cell array comprising:
asserting said external, negative erasing voltage (VNN) pin; and
asserting said external, positive programming voltage (VPP) pin to thereby force a corrected threshold voltage ($V_t$) onto said memory cell array.

12. The device according to claim 11 further comprising a means of selectively correcting said threshold voltage at specific locations of said memory cell array.

13. The device according to claim 12 wherein said means of selectively correcting said threshold voltage is mode selected based on a data bus input value to said device.

14. A multiple time programmable memory device comprising:
a memory cell array including a means of electrical erasability and electrical programmability wherein said memory cell array comprises Flash memory cells;
a package having an external pin configuration that conforms to the JEDEC standard for an EPROM device wherein an external, positive programming voltage (VPP) pin is provided; and
an external, negative erasing voltage (VNN) pin multiplexed with a chip enable bar (CEB) pin.

15. The device according to claim 14 wherein said external pin configuration further comprises a program enable bar (PGMB) pin.

16. The device according to claim 14 wherein said package comprises a dual in-line (DIP) package and wherein said external pin configuration further consists of one of the group of: JEDEC standard 64 kilobit configuration, JEDEC standard 128 kilobit configuration, JEDEC standard 256 kilobit configuration, JEDEC standard 512 kilobit configuration, JEDEC standard 1 megabit configuration, JEDEC standard 2 megabit configuration, JEDEC standard 4 megabit configuration, and JEDEC standard 8 megabit configuration.

17. The device according to claim 14 wherein said package comprises a plastic-leaded chip-carrier (PLCC) package and wherein said external pin configuration further consists of one of the group of: JEDEC standard 64 kilobit configuration, JEDEC standard 128 kilobit configuration, JEDEC standard 256 kilobit configuration, JEDEC standard 512 kilobit configuration, JEDEC standard 1 megabit configuration, JEDEC standard 2 megabit configuration, JEDEC standard 4 megabit configuration, and JEDEC standard 8 megabit configuration.

18. The device according to claim 14 wherein said means of electrical erasability comprises:
asserting said external, negative erasing voltage (VNN) pin; and
asserting said external, positive programming voltage (VPP) pin to thereby clear said memory cell array.

19. The device according to claim 18 further comprising a means of selectively erasing parts of said memory cell array depending on an address value input to said device.

20. The device according to claim 14 further comprising a means to verify erasure comprising:
asserting said external, negative erasing voltage (VNN) pin;
asserting said output enable bar (OEB) pin;
forcing address bus of said device to a selected address; and
reading data bus of said device to thereby verify that said selected address is erased.

21. The device according to claim 14 wherein said means of electrical programmability comprises:
asserting said external, positive programming voltage (VPP) pin;
asserting said chip enable bar (CEB) pin;
forcing address bus of said device to a selected address; and forcing data bus of said device to a selected value to thereby write said selected value to said selected address of said memory cell array.

22. The device according to claim 14 further comprising a means to correct threshold voltage ($V_t$) values of said memory cell array comprising:
   asserting said external, negative erasing voltage (VNN) pin; and
   asserting said external, positive programming voltage (VPP) pin to thereby force a corrected threshold voltage ($V_t$) onto said memory cell array.

23. The device according to claim 22 further comprising a means of selectively correcting said threshold voltage at specific locations of said memory cell array.

24. The device according to claim 23 wherein said means of selectively correcting said threshold voltage is mode selected based on a data bus input value to said device.

25. A method to electrically erase a multiple time programmable device having a memory cell array including a means of electrical erasability and electrical programmability, having a package with a pin configuration that conforms to the JEDEC standard for an EPROM device, having an external, positive programming voltage (VPP) pin, and having an external, negative erasing voltage (VNN) pin that is multiplexed with a chip enable bar (CEB) pin, said method comprising:
   asserting said external, negative erasing voltage (VNN) pin;
   asserting said external, positive programming voltage (VPP) pin; and
   forcing address bus of said device to a selected address to thereby selectively erase a part of said memory cell array wherein said erased part consists of one of the group of: single memory array block and whole memory array.

26. The method according to claim 25 further comprising de-asserting a program enable bar (PGMB) pin.

27. The method according to claim 25 further comprising a method to verify erasure comprising:
   asserting said external, negative erasing voltage (VNN) pin;
   asserting said output enable bar (OEB);
   forcing address bus of said device to an address value equal to a starting address; and
   reading a sequence of memory cell locations wherein said reading comprises:
      asserting said chip enable bar (CEB) pin to read a data value at said address value to thereby verify that said selected address is erased; and
      testing said address value wherein said address value is incremented and said reading sequence is repeated if less than a final value and wherein said reading sequence ends if equal to said final value.

28. A method to electrically program a multiple time programmable device having a memory cell array including a means of electrical erasability and electrical programmability, having a package with a pin configuration that conforms to the JEDEC standard for an EPROM device, having an external, positive programming voltage (VPP) pin, and having an external, negative erasing voltage (VNN) pin that is multiplexed with a chip enable bar (CEB) pin, said method comprising:
   forcing address bus of said device to an address value equal to a starting address;
   asserting said external, positive programming voltage (VPP) pin; and
   programming a sequence of memory cell locations wherein said programming comprises:
      forcing data bus of said device to a selected value;
      asserting said chip enable bar (CEB) pin to thereby write said selected value to said selected address of said memory cell array;
      de-asserting said chip enable bar (CEB) pin; and
      testing said address value wherein said address value is incremented and said programming sequence is repeated if less than a final value and wherein said programming sequence ends if equal to said final value.

29. The method according to claim 28 further comprising asserting a program enable bar (PGMB) pin instead of said step of asserting said chip enable bar (CEB) pin.

30. The method according to claim 28 further comprising a method to verify programming comprising:
   asserting said output enable bar (OEB);
   forcing address bus of said device to an address value equal to a starting address; and
   reading a sequence of memory cell locations wherein said reading comprises:
      asserting said chip enable bar (CEB) pin to read a data value at said address value to thereby verify that said selected address is programmed; and
      testing said address value wherein said address value is incremented and said reading sequence is repeated if less than a final value and wherein said reading sequence ends if equal to said final value.

31. A method to correct a threshold voltage ($V_t$) of a multiple time programmable device having a memory cell array including a means of electrical erasability and electrical programmability, having a package with a pin configuration that conforms to the JEDEC standard for an EPROM device, having an external, positive programming voltage (VPP) pin, and having an external, negative erasing voltage (VNN) pin that is multiplexed with a chip enable bar (CEB) pin, said method comprising:
   asserting said external, positive programming voltage (VPP) pin;
   asserting said external, negative erasing voltage (VNN) pin; and
   asserting a correction select pin to threshold correct entire said memory array.

32. The method according to claim 31 wherein said correction select pin comprises a data bus input to said device.

33. The method according to claim 31 further comprising a method to verify correction comprising:
   asserting said external, negative erasing voltage (VNN) pin;
   asserting said output enable bar (OEB);
   forcing address bus of said device to an address value equal to a starting address; and
   reading a sequence of memory cell locations wherein said reading comprises:
      asserting said chip enable bar (CEB) pin to read a data value at said address value to thereby verify that said selected address is corrected; and
      testing said address value wherein said address value is incremented and said reading sequence is repeated if less than a final value and wherein said reading sequence ends if equal to said final value.

34. A method to correct a threshold voltage ($V_t$) of a multiple time programmable device having a memory cell array including a means of electrical erasability and electrical programmability, having a package with a pin configuration that conforms to the JEDEC standard for an EPROM device, having an external, positive programming voltage (VPP) pin, and having an external, negative erasing voltage (VNN) pin that is multiplexed with a chip enable bar (CEB) pin, said method comprising:

- asserting said external, negative erasing voltage (VNN) pin;
- forcing address bus of said device to an address value equal to a starting address;
- asserting said external, positive programming voltage (VPP) pin; and
- threshold correcting a sequence of memory cell locations wherein said threshold correcting comprises:
  - asserting a correction select pin to threshold correct said address value in said memory cell array;
  - de-asserting said correction select pin; and
  - testing said address value wherein said address value is incremented and said threshold correcting sequence is repeated if less than a final value and wherein said threshold correcting sequence ends if equal to said final value.

35. The method according to claim 34 wherein said correction select pin comprises a data pin input to said device.

36. The method according to claim 34 further comprising a method to verify correction comprising:

- asserting said external, negative erasing voltage (VNN) pin;
- asserting said output enable bar (OEB);
- forcing address bus of said device to an address value equal to a starting address; and
- reading a sequence of memory cell locations wherein said reading comprises:
  - asserting said chip enable bar (CEB) pin to read a data value at said address value to thereby verify that said selected address is corrected; and
  - testing said address value wherein said address value is incremented and said reading sequence is repeated if less than a final value and wherein said reading sequence ends if equal to said final value.

* * * * *